(12) United States Patent
Chiang et al.

(10) Patent No.: US 11,244,871 B2
(45) Date of Patent: Feb. 8, 2022

(54) METHODS OF FABRICATING SEMICONDUCTOR DEVICES FOR TIGHTENING SPACING BETWEEN NANOSHEETS IN GAA STRUCTURES AND STRUCTURES FORMED THEREBY

(71) Applicant: Taiwan Semiconductor Manufacturing Co., Ltd., Hsinchu (TW)

(72) Inventors: Kuo-Cheng Chiang, Hsinchu (TW); Chung-Wei Hsu, Hsinchu County (TW); Lung-Kun Chu, New Taipei (TW); Mao-Lin Huang, Hsinchu (TW); Jia-Ni Yu, New Taipei (TW); Chih-Hao Wang, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 71 days.

(21) Appl. No.: 16/454,598

(22) Filed: Jun. 27, 2019

(65) Prior Publication Data
US 2020/0411387 A1    Dec. 31, 2020

(51) Int. Cl.
| H01L 21/8238 | (2006.01) |
| H01L 21/02 | (2006.01) |
| H01L 27/092 | (2006.01) |
| H01L 29/423 | (2006.01) |
| H01L 29/66 | (2006.01) |
| H01L 29/78 | (2006.01) |

(52) U.S. Cl.
CPC ......... *H01L 21/823821* (2013.01); *H01L 21/02603* (2013.01); *H01L 21/823814* (2013.01); *H01L 21/823842* (2013.01); *H01L 27/0924* (2013.01); *H01L 29/42392* (2013.01); *H01L 29/66545* (2013.01); *H01L 29/66795* (2013.01); *H01L 29/785* (2013.01)

(58) Field of Classification Search
CPC ................................................. H01L 29/42392
See application file for complete search history.

(56) References Cited

U.S. PATENT DOCUMENTS

| 9,209,247 B2 | 12/2015 | Colinge et al. |
| 9,236,267 B2 | 1/2016 | De et al. |

(Continued)

*Primary Examiner* — Moin M Rahman
*Assistant Examiner* — Mohammad A Rahman
(74) *Attorney, Agent, or Firm* — Birch, Stewart, Kolasch & Birch, LLP

(57) ABSTRACT

A method of fabricating semiconductor devices includes forming a plurality of first and second semiconductor nanosheets in p-type and n-type device regions, respectively. An n-type work function layer is deposited to surround each of the first and second semiconductor nanosheets. A passivation layer is deposited on the n-type work function layer to surround each of the first and second semiconductor nanosheets. A patterned mask is formed on the passivation layer in the n-type device region, and the n-type work function layer and the passivation layer in the p-type device region are removed in an etching process using the patterned mask as an etching mask. Then, the patterned mask is removed, and a p-type work function layer is deposited to surround the first semiconductor nanosheets and to cover the passivation layer.

20 Claims, 18 Drawing Sheets

(56) References Cited

U.S. PATENT DOCUMENTS

| | | | |
|---|---|---|---|
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 9,748,404 B1 * | 8/2017 | Chang | H01L 29/66772 |
| 9,997,519 B1 * | 6/2018 | Bao | H01L 29/4966 |
| 2011/0254101 A1 * | 10/2011 | Xiao | H01L 27/1211 |
| | | | 257/369 |
| 2013/0029484 A1 * | 1/2013 | Shimizu | H01L 21/31144 |
| | | | 438/636 |
| 2016/0351675 A1 * | 12/2016 | Patil | H01L 29/66545 |
| 2017/0141188 A1 * | 5/2017 | Lee | H01L 29/42392 |
| 2017/0373058 A1 * | 12/2017 | Tsau | H01L 29/66545 |
| 2018/0277682 A1 * | 9/2018 | Zhu | B82Y 10/00 |
| 2018/0342427 A1 * | 11/2018 | Xie | H01L 21/32133 |
| 2020/0043808 A1 * | 2/2020 | Bao | H01L 21/3215 |
| 2020/0083326 A1 * | 3/2020 | Ok | H01L 27/092 |
| 2020/0312981 A1 * | 10/2020 | Bomberger | H01L 29/7853 |

* cited by examiner

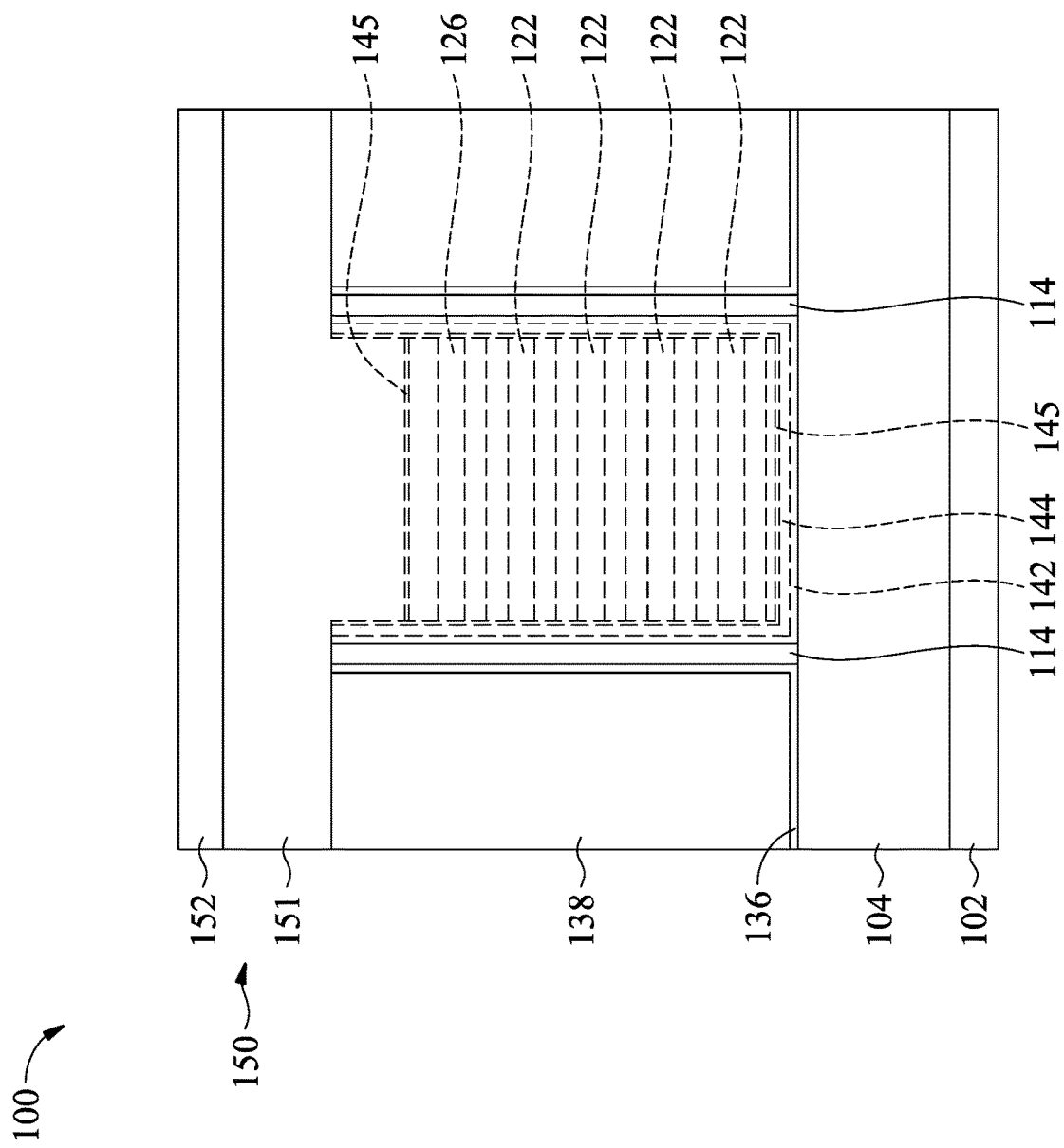

METHODS OF FABRICATING SEMICONDUCTOR DEVICES FOR TIGHTENING SPACING BETWEEN NANOSHEETS IN GAA STRUCTURES AND STRUCTURES FORMED THEREBY

BACKGROUND

The semiconductor integrated circuit (IC) industry has experienced exponential growth. Technological advances in IC materials and designs have produced generations of ICs where each generation has smaller and more complex circuits than the previous generation. As the semiconductor IC industry has progressed into nanometer technology nodes in pursuit of higher device density, higher performance, and lower costs, challenges from both fabrication and design issues have resulted in the development of three-dimensional designs, such as a Fin Field Effect Transistor (FinFET).

FinFET devices typically include semiconductor fins with high aspect ratios. A gate structure is formed over and along the sides of the fin (e.g., wrapping) utilizing the advantage of the increased surface area of the channel to produce faster, more reliable, and better-controlled semiconductor transistor devices. In the development of FinFET devices, the gate structure may be developed into a gate-all-around (GAA) structure. However, since device feature sizes continue to decrease, fabrication processes continue to become more difficult to perform. There are still various challenges in the fabrication of FinFET devices with GAA structures.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2D, 2E, 2F, 2G, 2H, 2I-1 and 2N show cross-sectional views of respective structures at various stages of an exemplary method for fabricating a semiconductor device along line II-IF in FIG. 1, in accordance with some embodiments.

FIGS. 2I-2, 2J-3, 2K, 2L and 2M show cross-sectional views of respective structures at various stages of an exemplary method for fabricating a semiconductor device along line A-A' in FIG. 1, in accordance with some embodiments.

FIG. 2J-1 shows a perspective view of a structure at one stage of an exemplary method for fabricating a semiconductor device, in accordance with some embodiments.

FIG. 2J-2 shows a front view of a structure at one stage of an exemplary method for fabricating a semiconductor device, in accordance with some embodiments.

DETAILED DESCRIPTION

Figure 1:
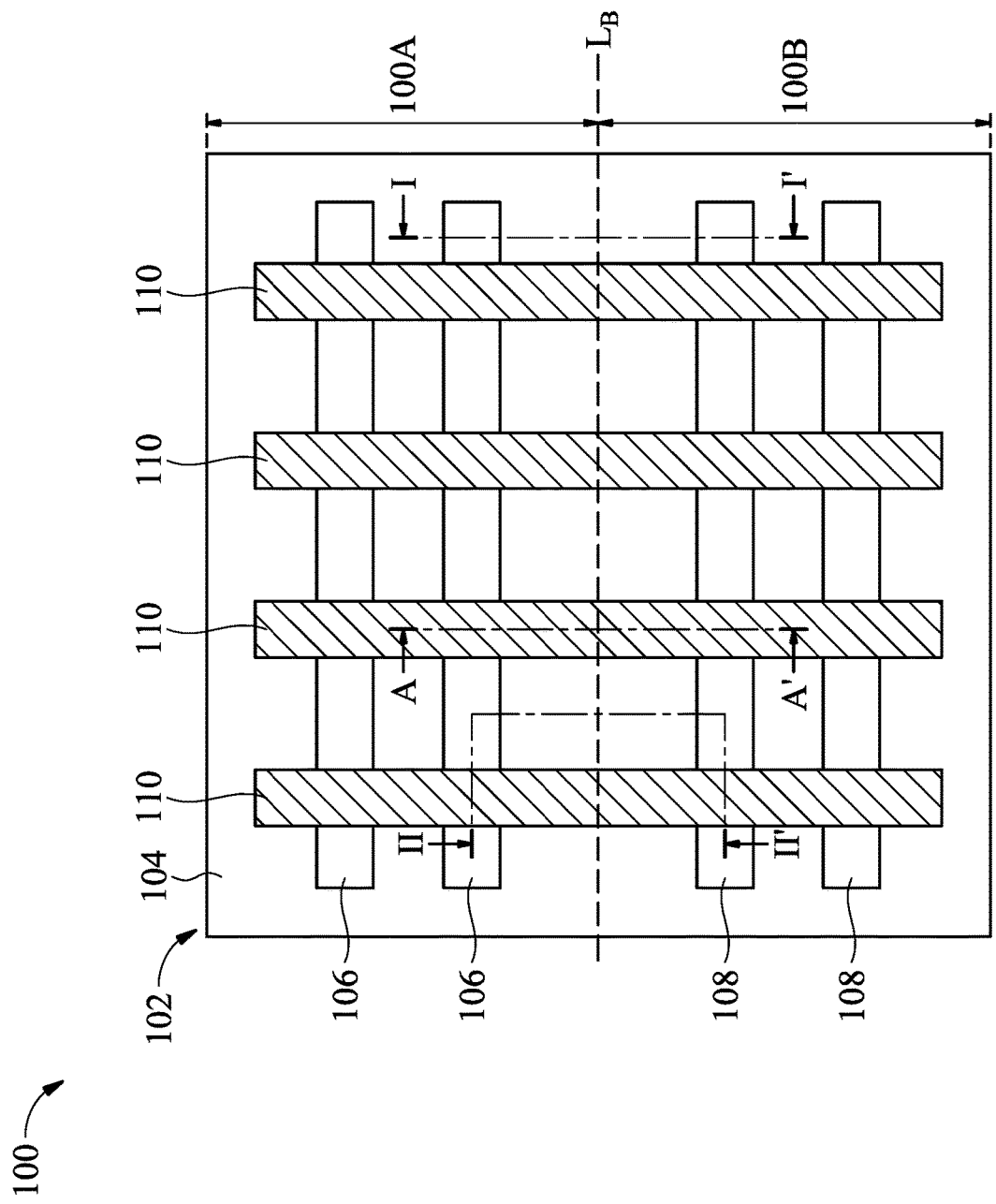
FIG. 1 shows a plane view of a structure at one stage of an exemplary method for fabricating a semiconductor device, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "under," "below," "lower," "on," "above," "upper," "top" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The gate-all-around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

For advanced technology of semiconductor devices, multiple threshold voltages (Vts) for device function flexibility become more and more important. Multiple patterning gates (MPGs) are used to enable multiple Vts in semiconductor devices such as FinFET devices with GAA structures. The GAA structures have a gate structure around nanosheets of FinFET devices. The performance of the FinFET devices with GAA structures is significantly enhanced with decreasing the spacing between the nanosheets. The spacing is also referred to as sheet-sheet spacing. However, the fabrication processes for MPGs face difficulties because of shrinkage of device dimension such as tightening the spacing between the nanosheets.

In addition, multiple Vts are arranged one next to another in various regions of a semiconductor device and may be referred to as mixed-Vts. When a wet over etching process is applied to ensure complete removal of gate material in one region, the gate material in another neighboring region may suffer loss and a mixed-Vts boundary between the MPGs may be varied. There are challenges in fabrication of MPGs having mixed-Vts, especially in advanced semiconductor devices such as FinFET devices for tightening spacing between nanowires or nanosheets in GAA structures at technology nodes of 5 nm (N5) and beyond.

Embodiments disclosed herein relate generally to fabricating semiconductor devices for tightening spacing between nanowires or nanosheets in GAA structures and structures formed thereby. For examples, the spacing between nanowires or nanosheets may be smaller than or equal to 8 nm. The semiconductor devices have mixed-Vts boundary of multiple patterning gates (MPGs). The embodiments of the disclosure provide an ultra-thin n-type work function (NWF) layer and a passivation layer on the ultra-thin NWF layer for n-type FETs (NFETs) and use an n-type metal gate (NMG) patterning-first process. The embodiments of the disclosure can avoid lateral removal of the NMG in NFET regions by a wet etching process and thereby enhance mixed-Vts boundary anchor. Therefore, the embodiments of the disclosure can avoid metal gate material loss and prevent from metal gate retreat along N/P boundary between NFET and p-type FET (PFET).

In addition, the embodiments of the disclosure can prevent metal element diffusion from the NMG toward PFET due to the ultra-thin NWF layer and the blocking ability of the passivation layer. Therefore, the embodiments of the disclosure can achieve high Vt, better Vt control in terms of Vt level and uniformity of PFETs in PFETs of the semiconductor devices. The semiconductor devices are such as FinFET devices for tightening spacing between nanowires or nanosheets in GAA structures with mixed-Vts at technology nodes of N5 and beyond. The tightening spacing between nanowires or nanosheets can gain performance and lower resistor-capacitor (RC) delay of the semiconductor devices.

The foregoing broadly outlines some aspects of the embodiments described herein. Some embodiments described herein are described in the context of FinFET devices, and more particularly, in the context of forming mixed-Vts boundary of multiple patterning gates (MPGs) for tightening spacing between nanowires or nanosheets in GAA structures of the FinFET devices. The GAA structures in p-type FET and n-type FET regions are formed using NMG patterning-first process with an ultra-thin NWF layer and a passivation layer on the ultra-thin NWF layer for NFETs. Some variations of the exemplary methods and structures are described. A person having ordinary skill in the art will readily understand other modifications may be made that are contemplated within the scope of other embodiments. Implementations of some aspects of the present disclosure may be used in other processes and/or in other devices. Throughout the various views and illustrative embodiments, like reference numbers are used to designate like elements. Although embodiments of the method may be described in a particular order, various other embodiments of the method may be performed in any logical order and may include fewer or more steps than what is described herein.

FIG. 1 illustrates a plane view of a structure at one stage of an exemplary method for fabricating a semiconductor device 100 such as a FinFET device, in accordance with some embodiments. At the stage, the semiconductor device 100 includes multiple dummy gate structures 110 formed on and across multiple fin structures 106 in a p-type device region such as a p-type FET (PPET) region 100A and multiple fin structures 108 in an n-type device region such as an n-type FET (NFET) region 100B. A boundary $L_B$ is located between the PFET region 100A and the NFET region 100B. Each of the fin structures 106 and 108 is surrounded and isolated by an isolation structure such as a shallow-trench-isolation (STI) structure 104. The fin structures 106 and 108, the dummy gate structures 110 and the STI structure 104 are formed on a substrate 102. Other aspects not illustrated in or described with respect to FIG. 1 may become apparent from the following figures and description. The structure in FIG. 1 may be electrically connected or coupled in a manner to operate one or more transistors, for example eight transistors in each of the PFET region 100A and the NFET region 100B.

Figure 2A:
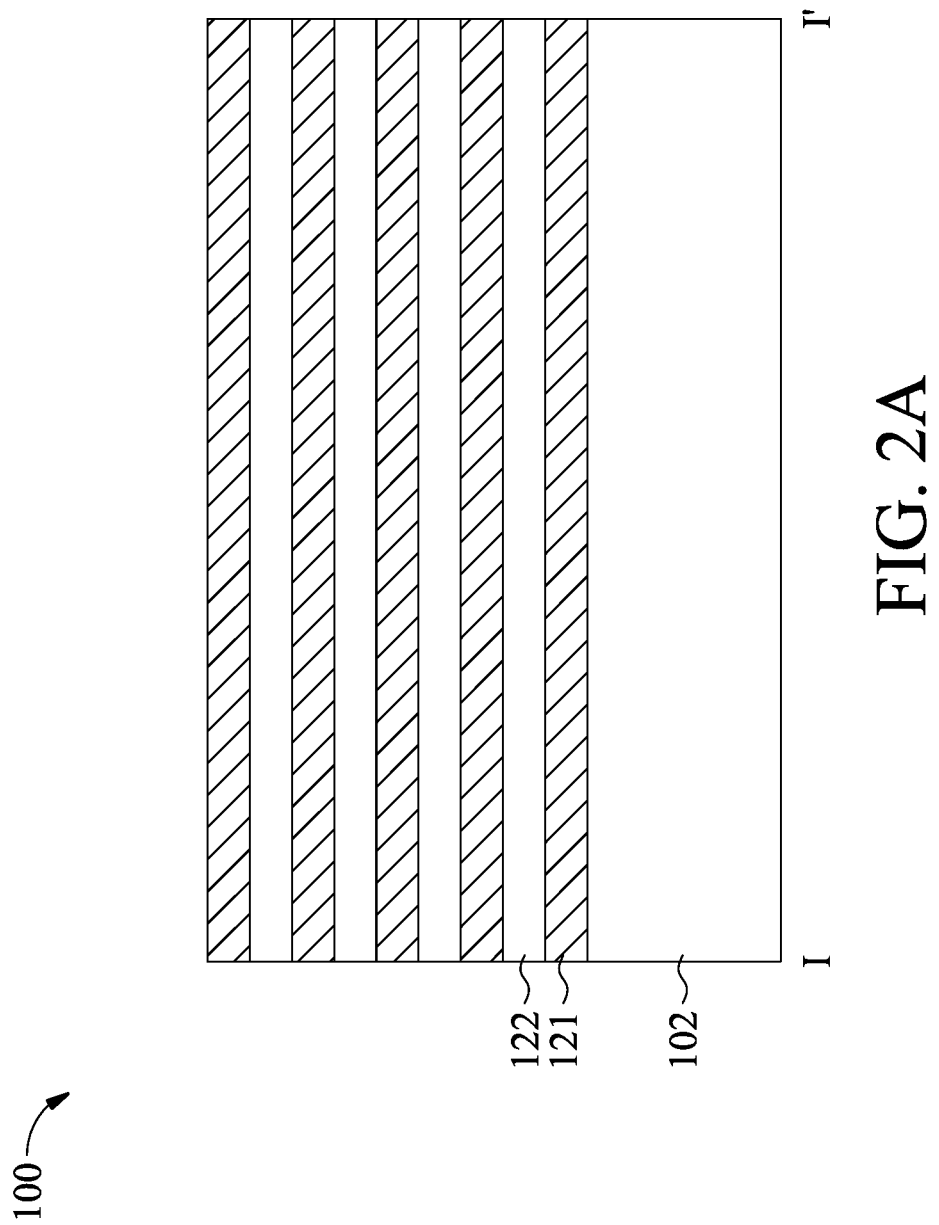
FIGS. 2A, 2B and 2C show cross-sectional views of respective structures at various stages of an exemplary method for fabricating a semiconductor device along line I-I' in FIG. 1, in accordance with some embodiments.
Figure 2B:
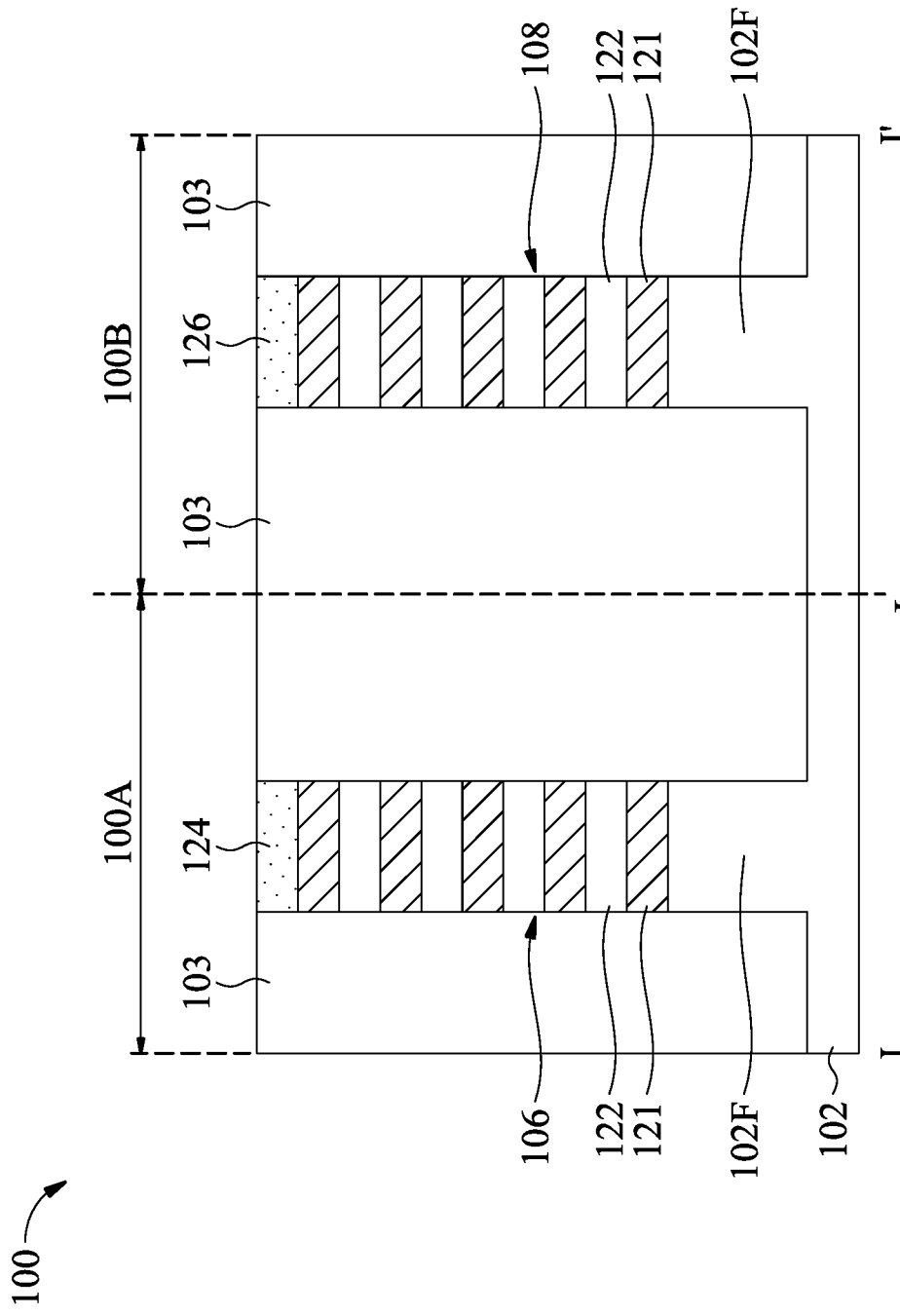
Figure 2C:
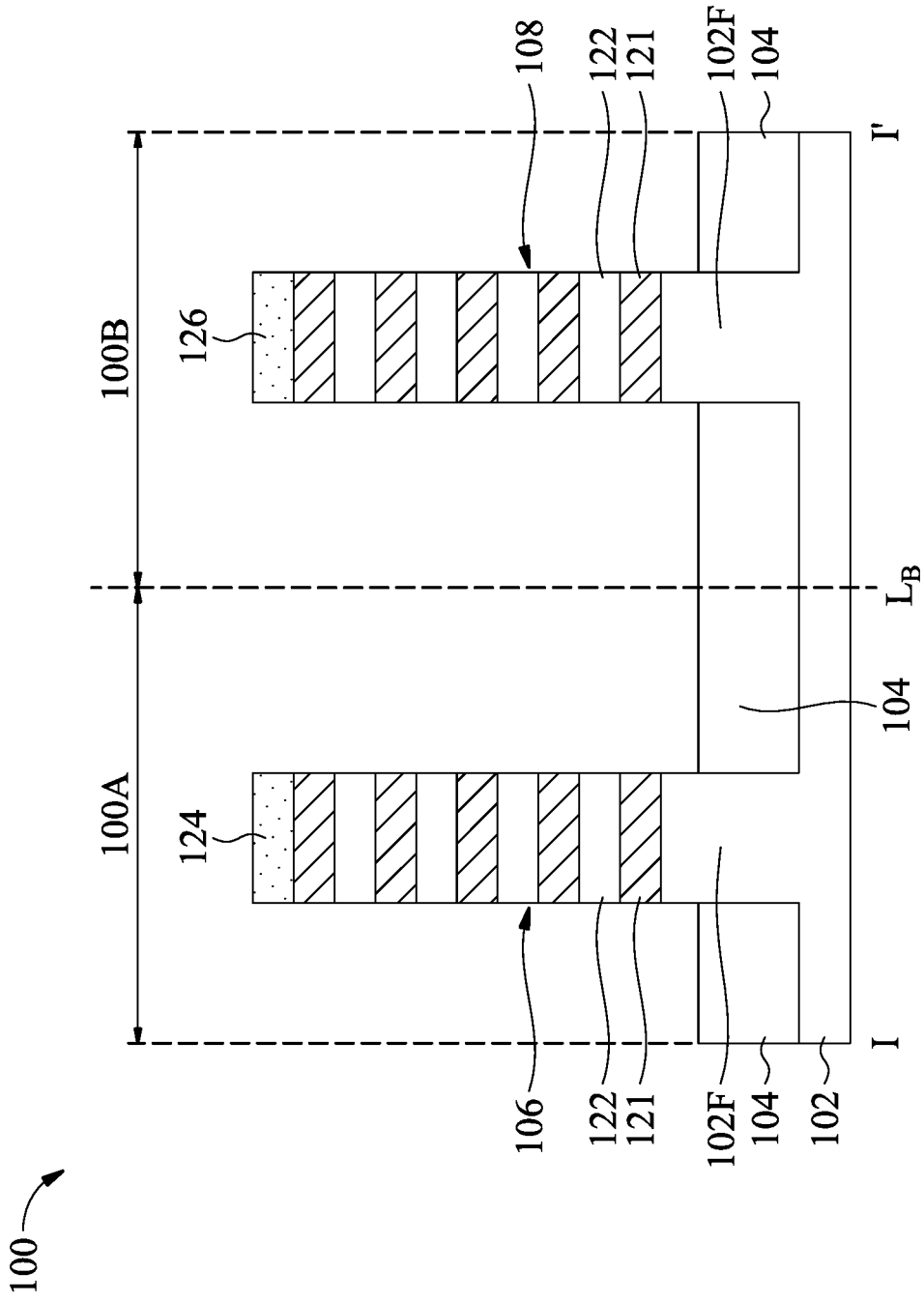

FIGS. 2A, 2B and 2C show cross-sectional views of respective structures at various stages of an exemplary method for fabricating the semiconductor device 100 along line I-I' in FIG. 1, in accordance with some embodiments. Line I-I' is on a plane that is parallel to the dummy gate structures 110 and across the fin structure 106 and the fin structure 108. Referring to FIG. 2A, firstly, a stack of alternating semiconductor layers 121 and 122 are blanketly deposited on the substrate 102, in accordance with some embodiments.

The substrate 102 may be a bulk semiconductor substrate, or a semiconductor-on-insulator (SOI) substrate, which may be doped (e.g., with a p-type or an n-type dopant) to form various well regions or doped regions therein, or undoped. Generally, an SOI substrate includes a layer of a semiconductor material formed on an insulator layer. The insulator layer may be a buried oxide (BOX) layer, a silicon oxide layer, or the like. The insulator layer is provided on a silicon or glass substrate. The substrate 102 may be made of silicon or another semiconductor material. For example, the substrate 102 is a silicon wafer. In some examples, the substrate 102 is made of a compound semiconductor such as silicon germanium (SiGe), silicon carbide (SiC), gallium arsenic (GaAs), indium arsenide (InAs), or indium phosphide (InP). In some examples, the substrate 102 is made of an alloy semiconductor such as GaAsP, AlInAs, AlGaAs, GaInAs, GaInP, or GaInAsP.

The semiconductor layers 121 and 122 are made of different materials, and those materials may be silicon, germanium, silicon germanium (SiGe), gallium arsenic (GaAs), indium arsenide (InAs), silicon carbide (SiC) or InGaAs. In some embodiments, the semiconductor layers 121 are made of SiGe, and the semiconductor layers 122 are made of Si. The semiconductor layer 121 may be firstly deposited on the substrate 102. Alternatively, the semiconductor layer 122 may be firstly deposited on the substrate 102. The semiconductor layers 121 and 122 are alternately deposited on the substrate 102 by different epitaxial growth processes. In some examples, the total number of layers in the stack of semiconductor layers 121 and 122 is between three and ten. For example, there may be nine layers. In some examples, the total thickness of the stacked semiconductor layers 121 and 122 is in a range from about 45 nm to about 90 nm.

Afterwards, referring to FIG. 2B, the substrate 102 and the stacked semiconductor layers 121 and 122 are patterned together using an etching process to form the fin structures 106 in the PFET region 100A and the fin structures 108 in the NFET region 100B, in accordance with some embodiments. The etching process may include a reactive ion etch (RIE), neutral beam etch (NBE), inductive coupled plasma (ICP) etch, or a combination thereof. A first hard mask 124 is formed over the stacked semiconductor layers 121 and 122 in the PFET region 100A to serve as an etching mask for forming the fin structures 106. A second hard mask 126 is formed over the stacked semiconductor layers 121 and 122 in the NFET region 100B to serve as an etching mask for forming the fin structures 108. The materials of the first and second hard masks 124 and 126 may be silicon nitride (SiN), silicon carbon nitride (SiCN), silicon oxycarbide (SiOC), silicon oxycarbon nitride (SiOCN) or a combination thereof. The first and second hard masks 124 and 126 may be formed together using deposition, photolithography and etching processes. Each of the fin structures 106 and 108 includes a fin base 102F and a fin stack on the fin base 102F. The fin base 102F is formed on the substrate 102. The fin stack is formed from the stacked semiconductor layers 121 and 122.

In addition, multiple trenches are formed in the substrate 102 and in the stacked semiconductor layers 121 and 122. Each of the trenches is between neighboring pairs of fin structures 106 or 108, or between neighboring fin structures 106 and 108. Next, the trenches are filled with an insulating material 103. The insulating material 103 is such as silicon oxide, silicon nitride, silicon oxynitride, fluoride-doped silicate glass (FSG), or another low dielectric constant (low-k) dielectric material. The trenches may be filled with the insulating material 103 using a deposition process, such as chemical vapor deposition (CVD), flowable CVD (FCVD), a spin-on-glass (SOG) process, or another applicable process. After the deposition process, a planarization process such as a chemical mechanical polishing (CMP) process is performed on the deposited insulating material 103 and then the insulating material 103 may be coplanar with the first and second hard masks 124 and 126.

Next, referring to FIG. 2C, the insulating material 103 between the neighboring pairs of fin structures 106, between the neighboring pairs of fin structures 108, and between the fin structures 106 and 108 is recessed by an etching process to form the STI structures 104, in accordance with some embodiments. The top surface of the STI structures 104 may be lower than or level with that the top surface of the fin base 102F. The etching process includes RIE, NBE or another suitable etching process.

In addition, a liner (not shown) may be conformally formed between the isolation structure 104 and the substrate 102, and also between the isolation structure 104 and the fin bases 102F. The material layer for forming the liner is conformally deposited on the bottoms and the sidewalls of the trenches between the neighboring pairs of fin structures 106, between the neighboring pairs of fin structures 108, and between the fin structures 106 and 108 before filling the trenches with the insulating material 103. The material of the liner may be silicon oxide, silicon nitride or silicon oxynitride. The material layer of the liner may be deposited using CVD, physical vapor deposition (PVD) or atomic layer deposition (ALD) process. The material layer of the liner is recessed together with the filled insulating material 103 by the etching process to form the liner of the isolation structures 104.

Figure 2D:
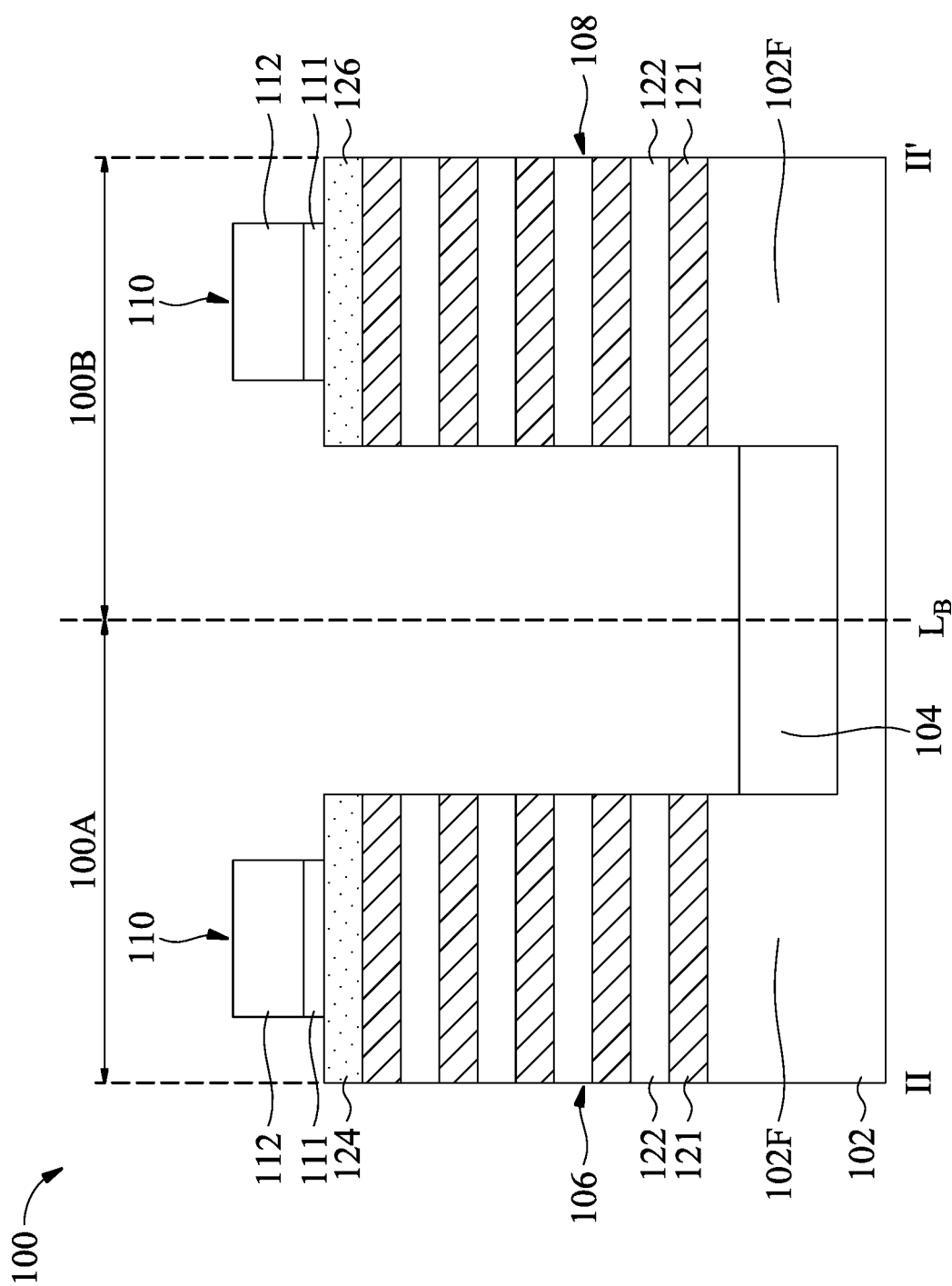

Afterwards, FIGS. 2D, 2E, 2F, 2G, 2H and 2I-1 show cross-sectional views of respective structures at various subsequent stages of an exemplary method for fabricating the semiconductor device 100 along line II-IF in FIG. 1, in accordance with some embodiments. Line II-IF is on a plane that is along the fin structure 106, across the isolation structure 104 and along the fin structure 108. The line II-IF is also across a portion of the dummy gate structure 110 in the PFET region 100A and another portion of the dummy gate structure 110 in the NFET region 100B. Referring to FIG. 2D, two portions of the dummy gate structure 110 are formed on the fin structures 106 and 108, in accordance with some embodiments. Although not shown in FIG. 2D, the dummy gate structure 110 is also formed across the fin structures 106 and 108, along the sidewalls and over the top surfaces of the fin structures 106 and 108. In addition, the dummy gate structure 110 is formed on the isolation structure 104. The longitudinal direction of the dummy gate structure 110 is perpendicular to the longitudinal direction of the fin structures 106 and 108. According to the embodiments of the disclosure, the dummy gate structure 110 will be replaced with a replacement gate structure in a gate-last process to form gate-all-around (GAA) structures for multiple patterning gates (MPG) in the PFET region 100A and the NFET region 100B. Moreover, the GAA structures are fabricated for tightening spacing between nanosheets or nanowires of the semiconductor device 100. The materials and processes of forming the GAA structures in the PFET region 100A and the NFET region 100B would be described with reference to FIGS. 2H, 2I-1, 2I-2, 2J-3, 2K, 2L and 2M.

The dummy gate structure 110 includes a dummy gate dielectric layer 111 and a dummy gate electrode layer 112 on the dummy gate dielectric layer 111. In some embodiments, the dummy gate electrode layer 112 is made of poly-silicon. The dummy gate dielectric layer 111 may be made of silicon oxide, silicon nitride, silicon oxynitride or another low dielectric constant (low-k) dielectric material. The dummy gate dielectric layer 111 and the dummy gate electrode layer 112 are deposited independently and then may be patterned together using photolithography and etching processes to from the dummy gate structures 110. The deposition processes for the dummy gate dielectric layer 111 and the dummy gate electrode layer 112 may include CVD, PVD, ALD, high density plasma CVD (HDPCVD), metal organic CVD (MOCVD), or plasma enhanced CVD (PECVD) process. The etching processes for forming the dummy gate structures 110 may include ME, NBE or another suitable etching process. In addition, a hard mask (not shown) is formed on the dummy gate electrode layer 112 to serve as an etching mask for forming the dummy gate structure 110.

Figure 2E:
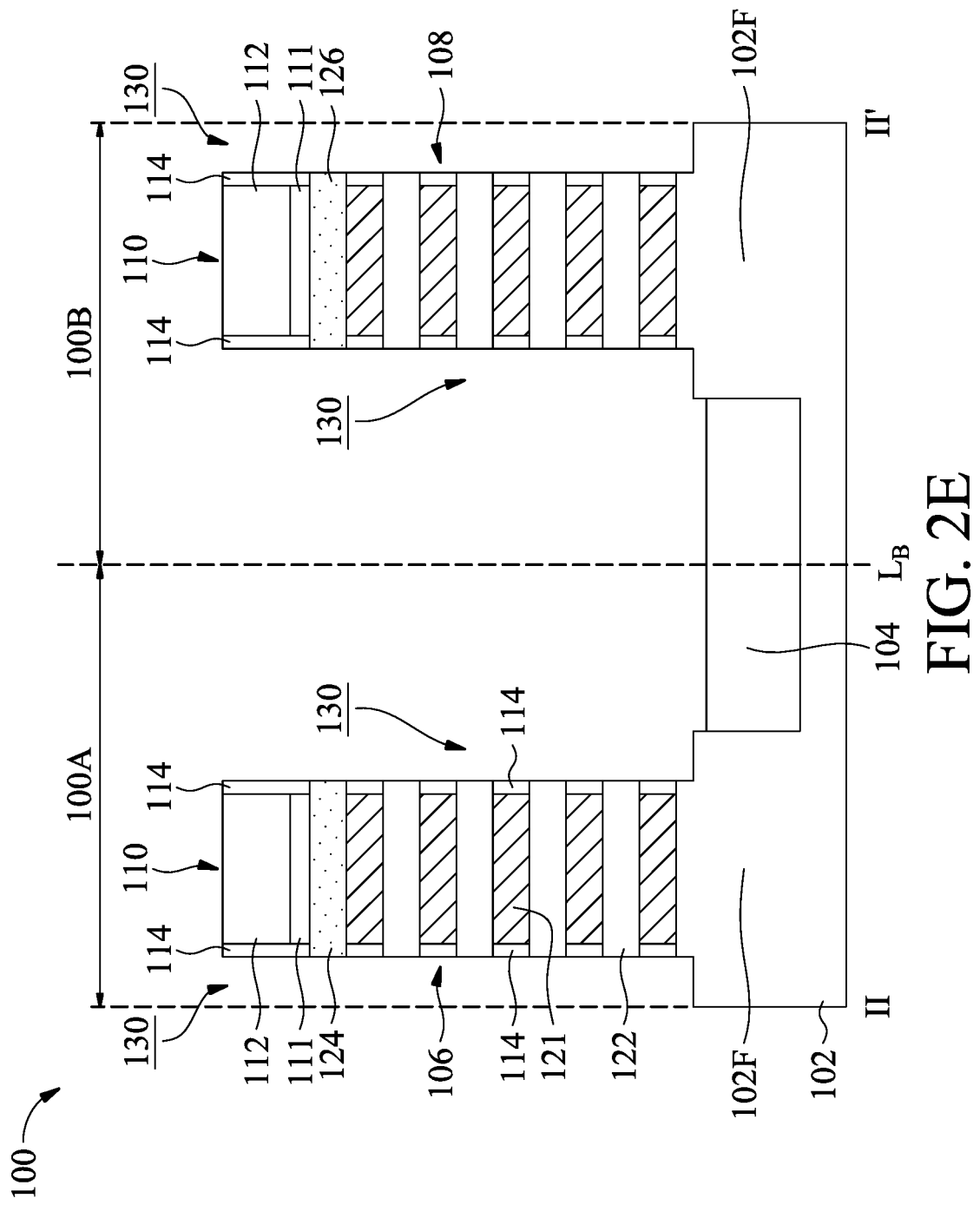

Next, referring to FIG. 2E, gate spacers 114 are formed along the sidewalls of the dummy gate structures 110, in accordance with some embodiments. In addition, the gate spacers 114 are also formed on the sidewalls of etched semiconductor layers 121. In some embodiments, firstly, the semiconductor layers 121 of the fin structures 106 and 108 at source and drain regions are etched using the dummy gate structures 110 as etching mask in an etching process. The etching process is for example plasma etching, RIE or another dry etching process. Afterwards, the gate spacers 114 may be formed by conformally depositing one or more spacer material layers on the dummy gate structures 110, along the sidewalls of the dummy gate structures 110 and along the sidewalls of the etched semiconductor layers 121, on the fin base 102F and the isolation structures 104. The spacer material layers may be made of different materials and have different thicknesses from each other. The one or more spacer material layers may include $SiO_2$, SiN, SiON, SiCN or a combination thereof, and may be deposited by CVD, ALD or another deposition process. The spacer material layers are then anisotropically etched to form the gate spacers 114. The etching process may include a RIE, NBE, or another etching process.

Afterwards, still referring to FIG. 2E, the first hard mask 124 and the semiconductor layers 122 of the fin structure 106 at the source and drain regions are etched using the dummy gate structure 110 and the gate spacers 114 as an etching mask to form recesses 130, in accordance with some embodiments. Also, the second hard mask 126 and the semiconductor layers 122 of the fin structure 108 at the source and drain regions are etched using the dummy gate structure 110 and the gate spacers 114 as an etching mask to form recesses 130. The recesses 130 may be formed using an isotropic etching process such as plasma etching, RIE or another dry etching process. Alternatively, the isotropic etching process may be a wet etching process that uses an etchant solution such as ammonium hydroxide-peroxide water mixture (APM), tetramethylammonium hydroxide (TMAH), ammonium hydroxide (NH$_4$OH), or another etchant. The bottom surfaces of the recesses 130 may be level with or lower than the top surface of the fin base 102F.

Figure 2F:
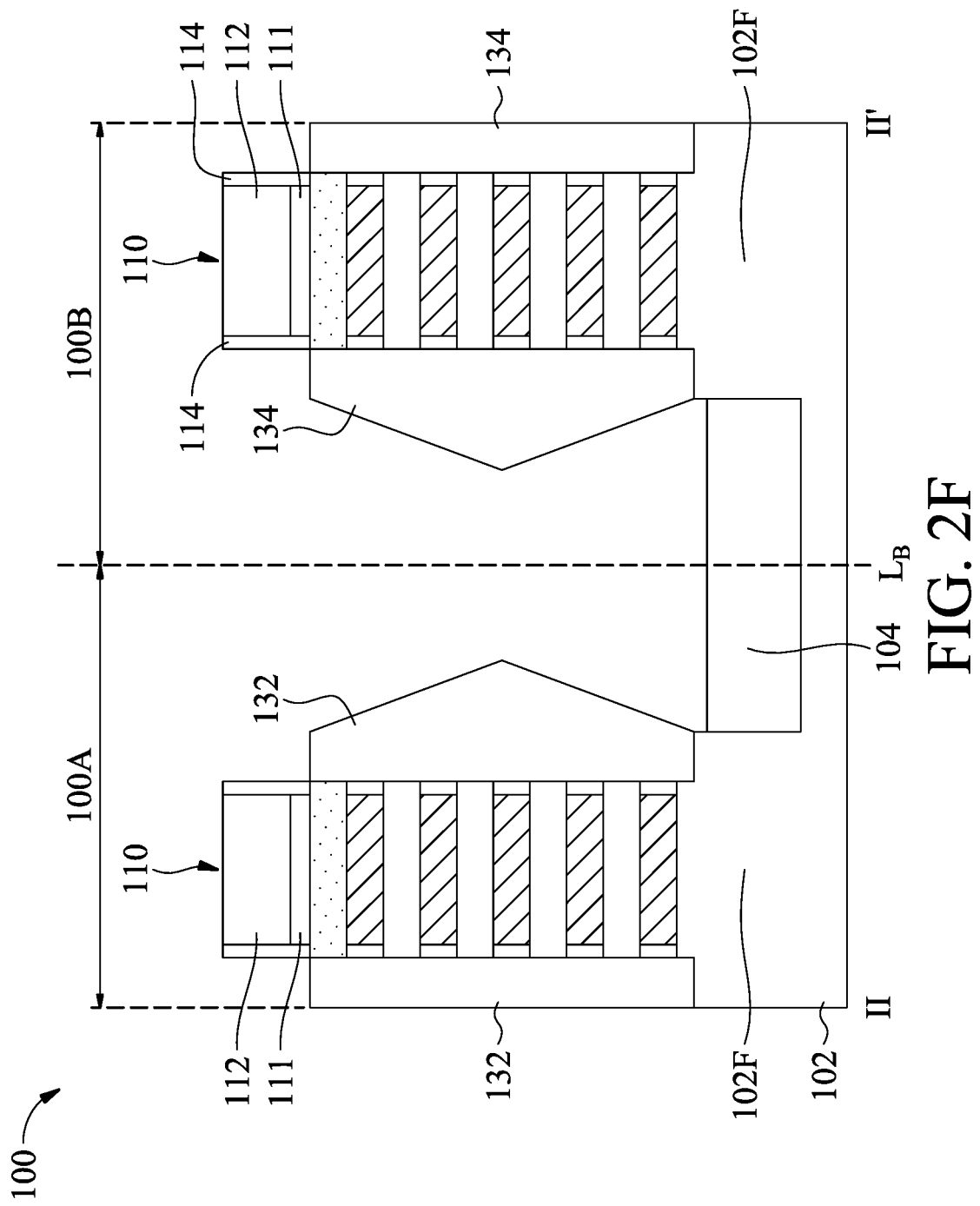

Next, referring to FIG. 2F, source and drain structures 132 are formed in the recesses 130 at the PFET region 100A, in accordance with some embodiments. The source and drain structures 132 are on opposite sides of the dummy gate structure 110, the first hard mask 124, the gate spacers 114 and the etched semiconductor layers 121 and 122. Also, source and drain structures 134 are formed in the recesses 130 at the NFET region 100B. The source and drain structures 134 are on opposite sides of the dummy gate structure 110, the second hard mask 126, the gate spacers 114 and the etched semiconductor layers 121 and 122. The source and drain structures 132 in the PFET region 100A and the source and drain structures 134 in the NFET region 100B may be made of different epitaxial semiconductor materials. The epitaxial semiconductor materials may be silicon germanium (SiGe1-x, where x can be between approximately 0 and 1), silicon carbide (SiC), silicon phosphorus, germanium, an III-V compound semiconductor, an II-VI compound semiconductor or another epitaxial semiconductor. The materials of an compound semiconductor include InAs, AlAs, GaAs, InP, GaN, InGaAs, InAlAs, GaSb, AlSb, AlP or GaP. In some examples, the source and drain structures 132 in the PFET region 100A are made of SiGe, and the source and drain structures 134 in the NFET region 100B are made of SiC.

The source and drain structures 132 and the source and drain structures 134 may be independently formed by metal-organic CVD (MOCVD), molecular beam epitaxy (MBE), liquid phase epitaxy (LPE), vapor phase epitaxy (VPE), selective epitaxial growth (SEG), or a combination thereof. The epitaxial source and drain structures 132 and 134 have several facets. In addition, the source and drain structures 132 and the source and drain structures 134 may be independently doped by in-situ doping during the epitaxial growth and/or by implantation after the epitaxial growth. In some instances, the top surfaces of the epitaxial source and drain structures 132 and 134 may be higher than or at the same level with the top surfaces of the first and second hard masks 124 and 126.

Moreover, some of the source and drain structures 132 in the PFET region 100A may be shared between two neighboring transistors, such as through coalescing the structures by epitaxial growth. Also, some of the source and drain structures 134 in the NFET region 100B may be shared between two neighboring transistors, such as through coalescing the structures by epitaxial growth. For example, the neighboring PFETs or NFETs with the shared source and drain structures may be implemented as two functional transistors. Other configurations in other examples may implement other numbers of functional transistors. In some embodiments, the source and drain structures 132 of the neighboring PFETs may be separated from each other. Also, the source and drain structures 134 of the neighboring NFETs may be separated from each other.

Figure 2G:
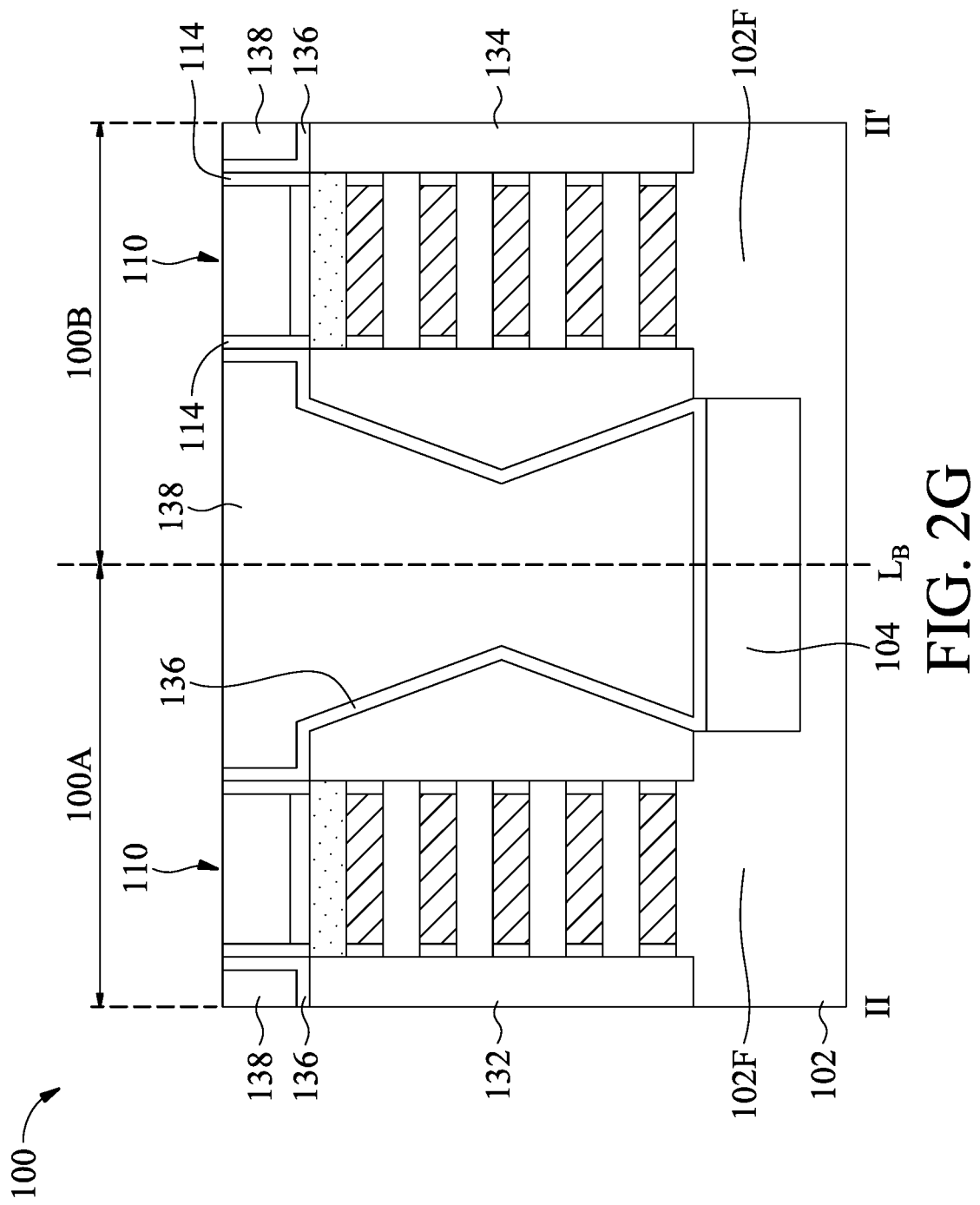

Next, referring to FIG. 2G, a contact etch stop layer (CESL) 136 and an interlayer dielectric (ILD) layer 138 are formed on the source and drain structures 132, the isolation structure 104 and the source and drain structures 134, in accordance with some embodiments. The CESL 136 is conformally deposited on the dummy gate structures 110, the gate spacers 114, the source and drain structures 132, the source and drain structures 134, and the isolation structure 104. The ILD layer 138 is deposited on the CESL 136.

Generally, the CESL 136 can provide a mechanism to stop an etching process when forming via contact holes for the source and drain structures 132 and 134. The CESL 136 may be formed of a dielectric material having a different etch selectivity from the adjacent ILD layer 138. The material of the CESL 136 may include silicon nitride (SiN or Si$_3$N$_4$), silicon carbon nitride (SiCN) or a combination thereof, and may be deposited by CVD, PECVD, ALD, or another deposition process. In some examples, the CESL 136 has a thickness in a range from about 2 nm to about 5 nm. The material of the ILD layer 138 may include silicon dioxide or a low-k dielectric material (e.g., a material having a dielectric constant (k-value) lower than the k-value (about 3.9) of silicon dioxide). The low-k dielectric material may include silicon oxynitride, phosphosilicate glass (PSG), borosilicate glass (BSG), borophosphosilicate glass (BPSG), undoped silicate glass (USG), fluorinated silicate glass (FSG), silicon oxycarbide (SiOxCy), Spin-On-Glass (SOG) or a combination thereof. The ILD layer 138 may be deposited by spin-on coating, CVD, Flowable CVD (FCVD), PECVD, PVD, or another deposition process.

Afterwards, a planarization process, for example a chemical mechanical polishing (CMP) process, is performed on the ILD layer 138 and the CESL 136. The hard mask on the dummy gate structure 110 and some upper portions of the gate spacers 114 are also removed in the planarization process. After the planarization process, the dummy gate electrode layers 112 are exposed. The top surfaces of the ILD layer 138 and the CESL 136 may be coplanar with the top surfaces of the dummy gate electrode layer 112 and the gate spacers 114.

Figure 2H:
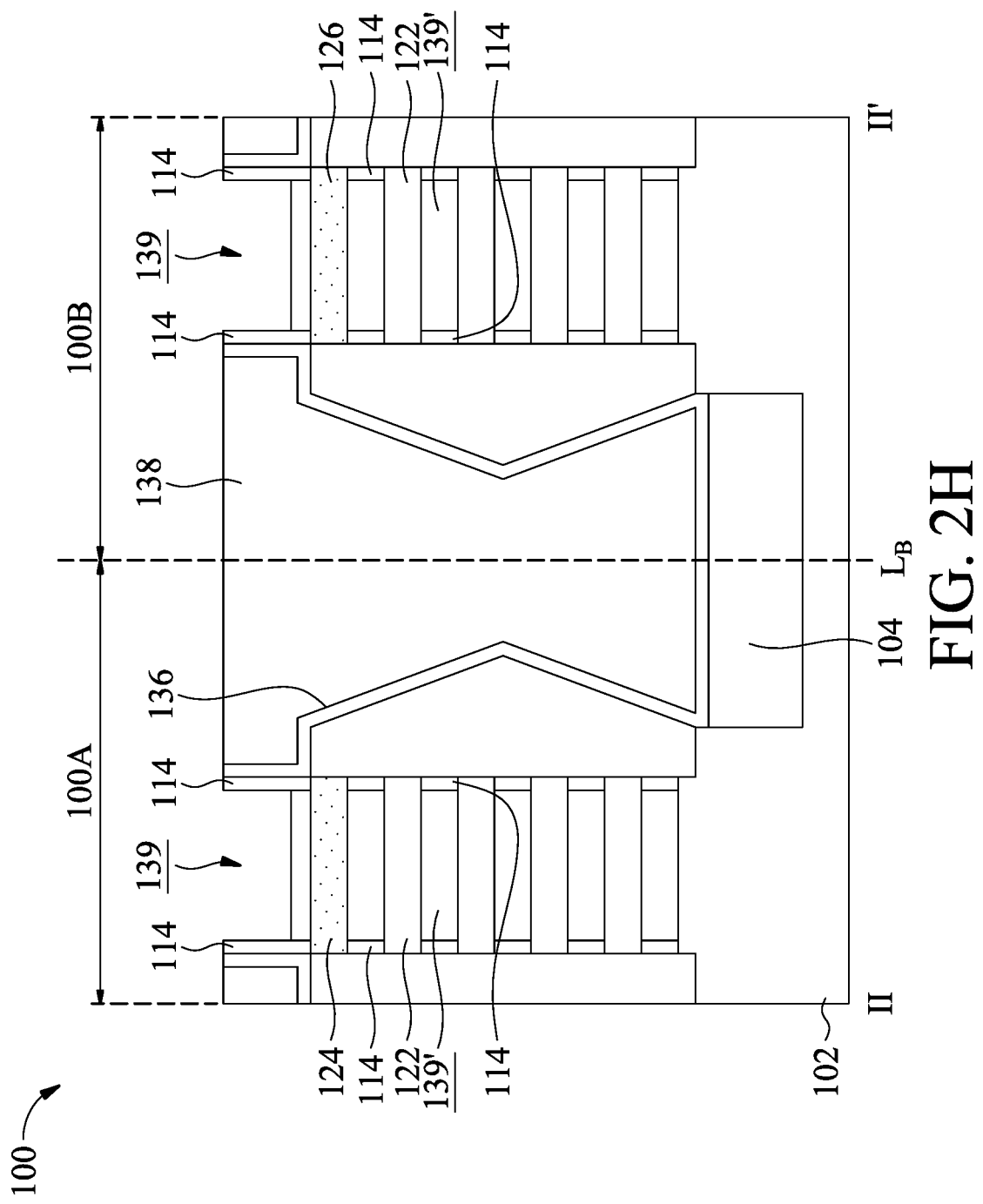

Next, referring to FIG. 2H, the dummy gate electrode layer 112, the dummy gate dielectric layer 111 and the semiconductor layers 121 (FIG. 2H) between the gate spacers 114 are removed using one or more etching processes, in accordance with some embodiments. Thereafter, in the PFET region 100A, a trench 139 is formed between the gate spacers 114 above the first hard mask 124, and multiple spaces 139' are formed between the gate spacers 114 under the first hard mask 124. Each of the space 139' is between the semiconductor layers 122. Also, in the NFET region 100B, a trench 139 is formed between the gate spacers 114 above the second hard mask 126, and multiple spaces 139' are formed between the gate spacers 114 under the second hard mask 126. Each of the space 139' is between the semiconductor layers 122. The gate spacers 114 under the first and second hard masks 124 and 126 may be referred to as inner spacers. The semiconductor layers 122 serve as channel layers of the semiconductor device 100.

In some embodiments, each of the spaces 139' between the neighboring semiconductor layers 122 has a height equal to or smaller than about 8 nm. In some instances, the height of the space 139' is in a range from about 8 nm to about 12 nm. The semiconductor layers 122 are spaced apart from each other by a distance that is in a range from about 8 nm to about 12 nm. Moreover, each of the semiconductor layers 122 has a thickness that is in a range from about 4 nm to about 6 nm. The semiconductor layers 122 may be referred to as nanosheets or nanowires. The spaces 139' may be referred to as sheet-sheet spacing. The embodiments of the disclosure are suitable for tightening spacing between nanosheets at technology nodes of 5 nm (N5) and beyond. For example, the spacing between nanosheets is equal to or smaller than about 8 nm, Furthermore, the embodiments of the disclosure can also be applied for other technology nodes of N20, N16, N10 and N7.

Figures 1, 2I:
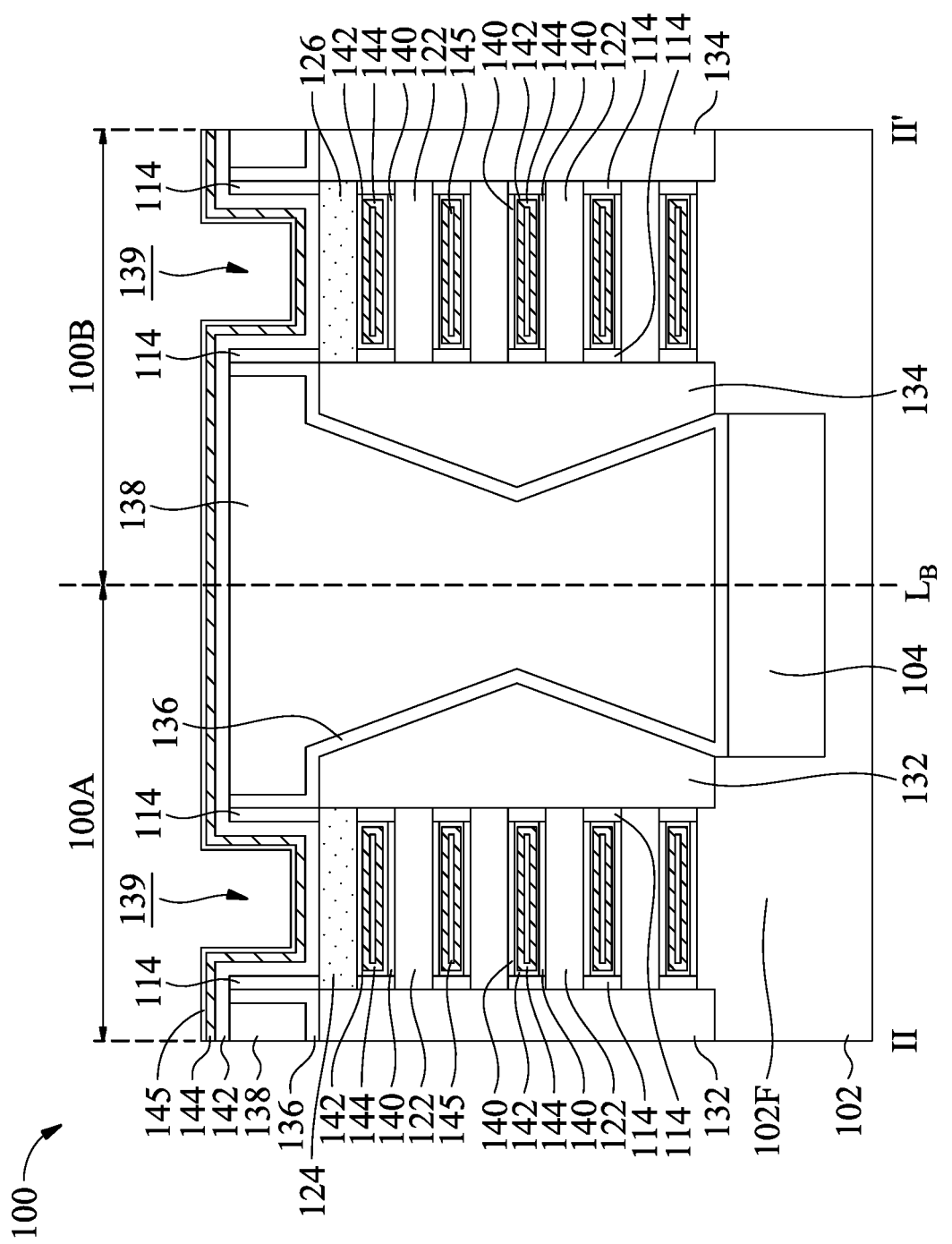

Next, referring to FIG. 2I-1, an interfacial layer (IL) 140 is formed on and around the semiconductor layers 122 and in the spaces 139', in accordance with some embodiments. The interfacial layer 140 may be silicon oxide and formed by deposition, chemical oxidation or thermal oxidation process. In some instances, the interfacial layer 140 may also be deposited on the first and second hard masks 124 and 126 and in the trenches 139. In some examples, the interfacial layer 140 has a thickness that is in a range from about 5 Å to about 15 Å.

Afterwards, still referring to FIG. 2I-1, a gate dielectric layer 142 is conformally deposited on the ILD layer 138, the CESL 136 and the gate spacers 114 and in the trenches 139, in accordance with some embodiments. In addition, the gate dielectric layer 142 is conformally deposited on the interfacial layer (IL) 140 and the gate spacers 114 in the spaces 139'. The gate dielectric layer 142 further surrounds the semiconductor layers 122. The gate dielectric layer 142 includes silicon oxide, silicon nitride, a high-k dielectric material, multilayers thereof, or other dielectric material. The high-k dielectric material may have a k-value greater than about 7.0. The high-k dielectric material may include a metal oxide of or a metal silicate of Hf, Al, Zr, La, Mg, Ba, Ti, Pb, or a combination thereof. In some examples, the gate dielectric layer 142 may be a high-k gate dielectric layer that includes AlOx, HfO$_2$, ZrO$_2$, HfAlOx, HfSiOx or a combination thereof. The gate dielectric layer 142 may be deposited by ALD, PECVD, molecular-beam deposition (MBD), or another deposition process. In some examples, the gate dielectric layer 142 has a thickness that is in a range from about 10 Å to about 20 Å.

Next, still referring to FIG. 2I-1, an ultra-thin n-type work function (NWF) layer 144 and a passivation layer 145 are conformally deposited in sequence on the gate dielectric layer 142 in the spaces 139' at both the PFET region 100A and the NFET region 100B, in accordance with some embodiments. The NWF layer 144 and the passivation layer 145 are also deposited on the gate dielectric layer 142 in the trenches 139 at both the PFET region 100A and the NFET region 100B.

Figures 2, 2I:
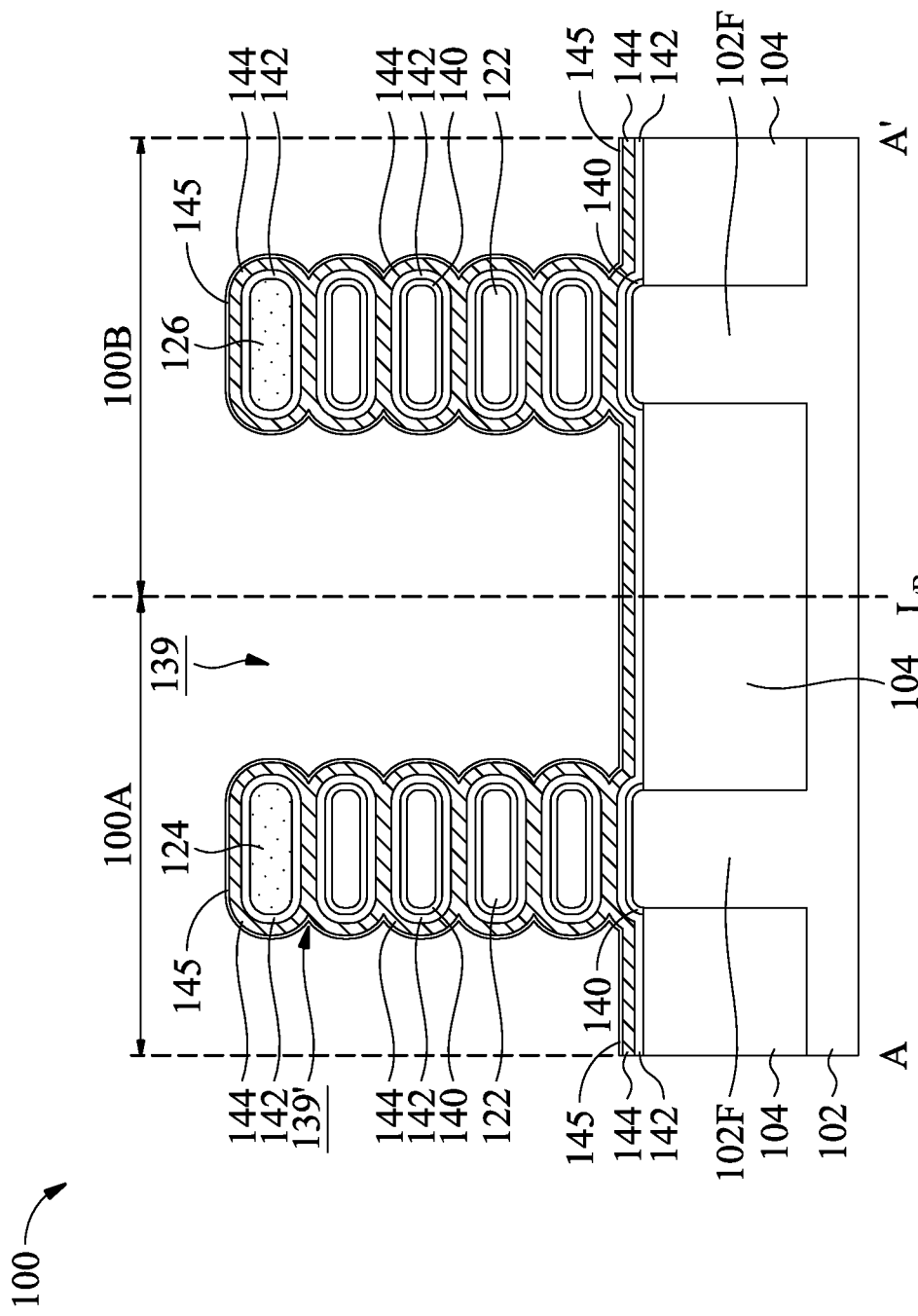

FIG. 2I-2 shows a cross-sectional view of the structure corresponding to FIG. 2I-1 at the stages of an exemplary method for fabricating the semiconductor device 100 along line A-A' in FIG. 1, in accordance with some embodiments. Line A-A' is on a plane that is along the center line of the dummy gate structure 110 in the PFET region 100A and the NFET region 100B, and across the fin structure 106, the isolation structure 104 and the fin structure 108.

Referring to FIG. 2I-2, in accordance with some embodiments, the semiconductor layers 122 in the PFET region 100A and the NFET region 100B are surrounded by the interfacial layer (IL) 140, the gate dielectric layer 142, the NWF layer 144 and the passivation layer 145 in sequence. Moreover, the first and second hard masks 124 and 126 are surrounded by the gate dielectric layer 142, the NWF layer 144 and the passivation layer 145 in sequence. The spaces 139' are full filled with the interfacial layer (IL) 140, the gate dielectric layer 142, the NWF layer 144 and the passivation layer 145. The trenches 139 (FIG. 2I-1) are not full filled with the gate dielectric layer 142, the NWF layer 144 and the passivation layer 145.

In addition, still referring to FIG. 2I-2, the interfacial layer (IL) 140 is formed on the exposed surfaces of the fin bases 102F, in accordance with some embodiments. The gate dielectric layer 142, the NWF layer 144 and the passivation layer 145 are conformally deposited on the top surfaces of the isolation structure 104 and the fin bases 102F. The passivation layer 145 covers the NWF layer 144, and some portions of the passivation layer 145 are merged in-between the semiconductor layers 122 (also referred to as nanosheets).

In some embodiments, the NWF layer 144 includes titanium aluminum carbide (TiAlC), titanium aluminide (TiAl), tantalum aluminum carbide (TaAlC), tantalum aluminum silicon carbide (TaAlSiC), titanium aluminum silicon carbide (TiAlSiC) or titanium aluminum nitride (TiAlN) and serves the Vt tuning of NFET. The NWF layer 144 has an aluminum (Al) content that is greater than or equal to 25 atom % and less than or equal to 36 atom %, i.e. 25 atom %≤Al content in the NWF layer 144≤36 atom %. Furthermore, the ultra-thin NWF layer 144 has a thickness T1 that is greater than or equal to 8 Å and smaller than or equal to 13 Å, i.e. 8Å Ti<13 Å. The NWF layer 144 may be deposited by ALD process. In addition, the passivation layer 145 includes silicon (Si) or silane (SiH$_4$). The passivation layer 145 has a thickness T2 that is greater than or equal to 3 Å and smaller than or equal to 15 Å, i.e. 3 Å<T2≤15 Å. The passivation layer 145 may be deposited by ALD process.

Figures 1, 2J:
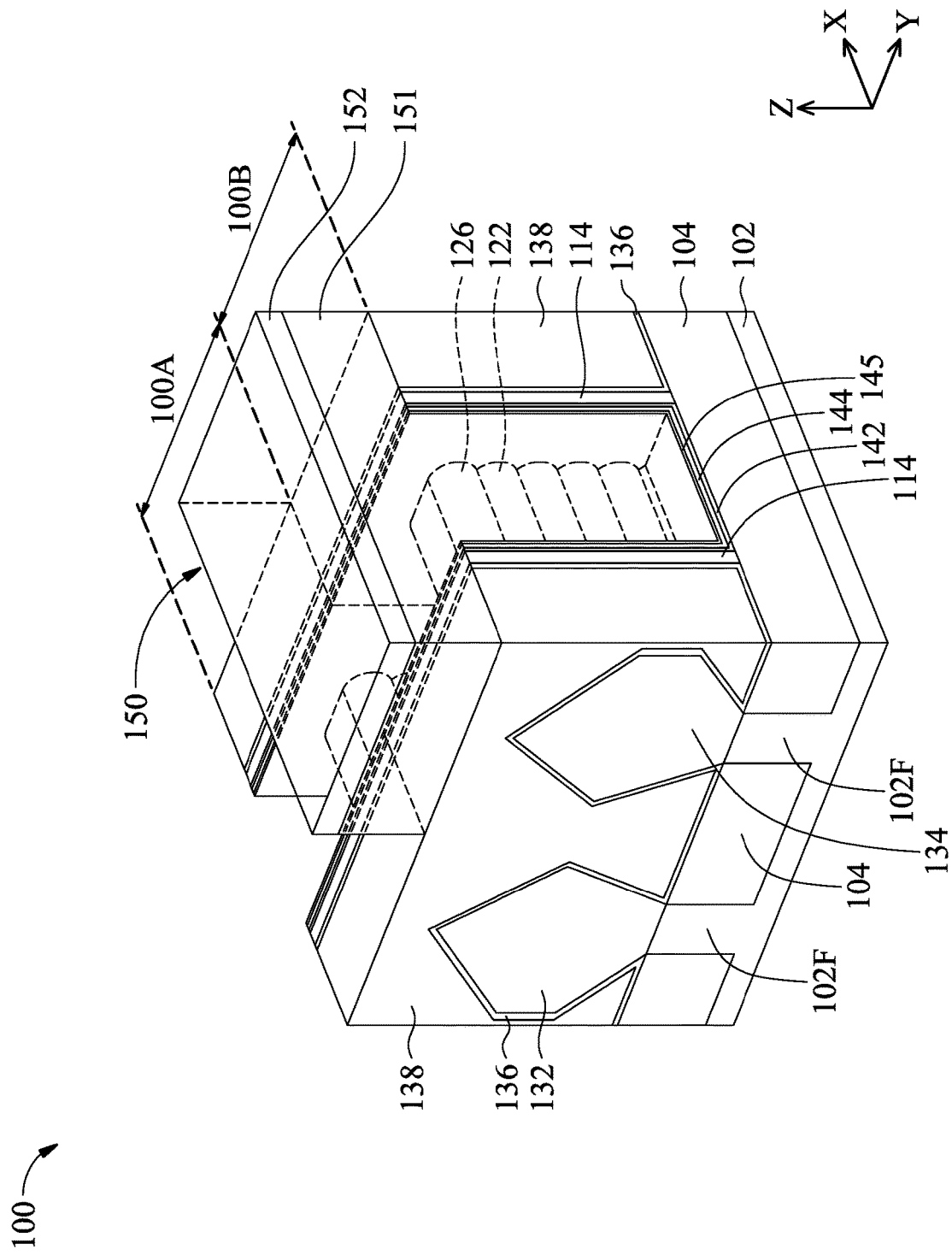
Figures 2, 2J, 3:
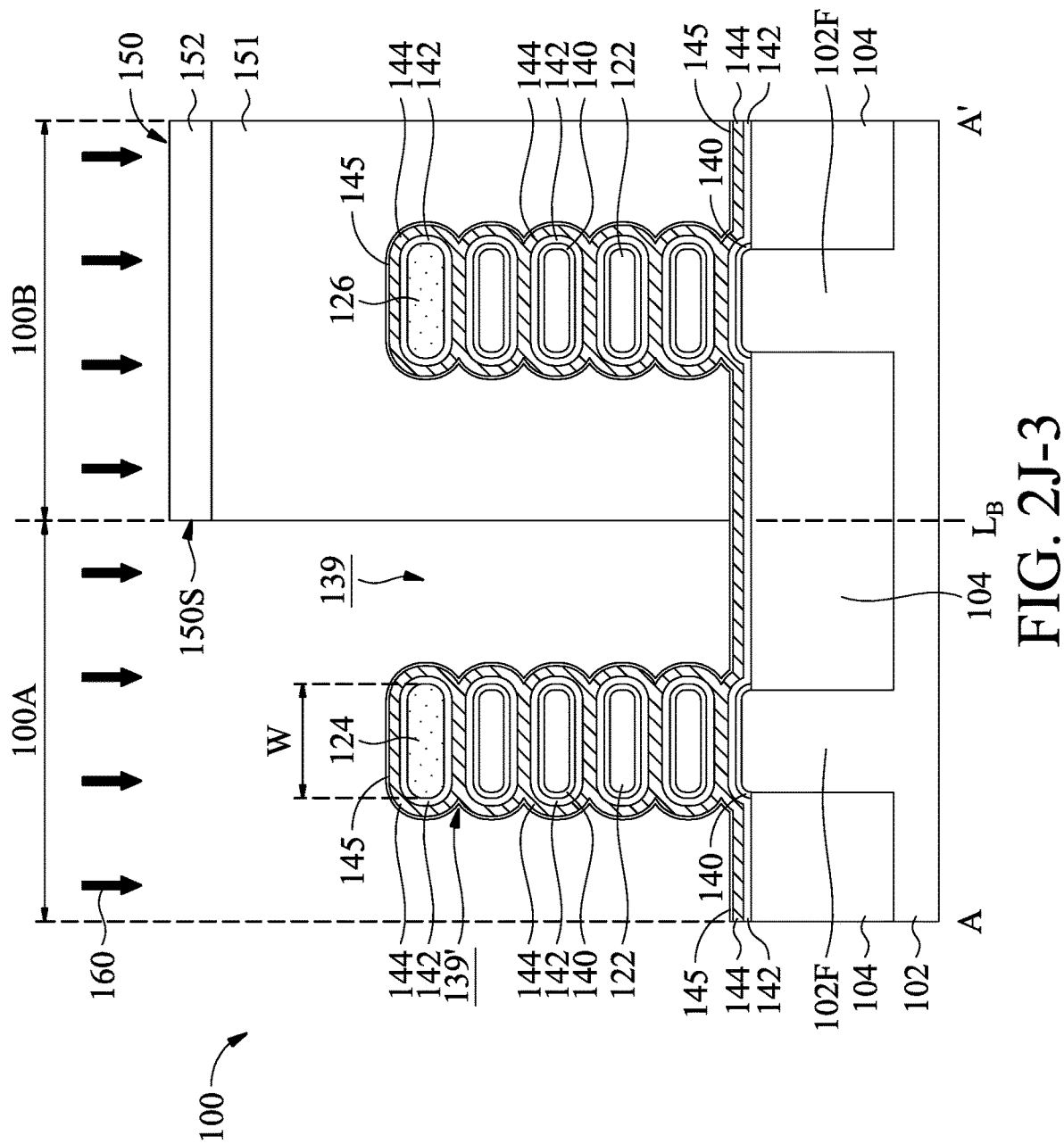

Next, FIG. 2J-1 shows a perspective view of a structure at one stage of an exemplary method for fabricating the semiconductor device 100, in accordance with some embodiments. FIG. 2J-2 shows a front view of the structure of FIG. 2J-1 viewed from the side of NFET region 100B, in accordance with some embodiments. In addition, FIG. 2J-3 shows a cross-sectional view of the structure of FIGS. 2J-1 and 2J-2 along line A-A' in FIG. 1, in accordance with some embodiments. Line A-A' is on a plane that is along the center line of the dummy gate structure 110 in the PFET region 100A and the NFET region 100B, and across the fin structure 106, the isolation structure 104 and the fin structure 108. Referring to FIGS. 2J-1, 2J-2 and 2J-3, a patterned mask 150 is formed on the passivation layer 145 in the NFET region 100B, in accordance with some embodiments. The patterned mask 150 has a sidewall 150S that is aligned with the boundary L$_B$ between the PFET region 100A and the NFET region 100B. The patterned mask 150 is formed to fill the trench 139 in the NFET region 100B and to cover the passivation layer 145, the NWF layer 144, the semiconductor layers 122, the second hard mask 126 and the isolation structure 104, as shown in FIG. 2J-3 in accordance with some embodiments.

In some embodiments, the patterned mask 150 includes a bottom anti-reflective coating (BARC) 151 and a photoresist 152 on the BARC 151. The BARC 151 of the patterned mask 150 is in direct contact with the passivation layer 145 and fills the trench 139 in the NFET region 100B. The material of the passivation layer 145 has excellent adhesion with the BARC 151 to enhance the boundary anchor during subsequent etching process for patterning the passivation layer 145 and the NWF layer 144. The patterned mask 150 is formed by coating a BARC material layer on the passivation layer 145 and then coating a photoresist layer on the BARC material layer. Afterwards, the photoresist layer and the BARC material layer are patterned together using a photolithography process to form the patterned mask 150. The sidewall 150S of the patterned mask 150 is defined by the photolithography process and aligned with the boundary L$_B$ between the PFET region 100A and the NFET region 100B. In addition, the BARC 151 of the patterned mask 150 is in contact with the top surfaces of the gate spacers 114, the CESL 136 and the ILD layer 138 in the NFET region 100B, as shown in FIGS. 2J-1 and 2J-2 in accordance with some embodiments. The top surface of the BARC 151 of the patterned mask 150 is higher than the top surfaces of the ILD layer 138, the CESL 136 and the gate spacers 114.

Next, FIGS. 2J-3, 2K, 2L and 2M show cross-sectional views of respective structures at various stages of an exemplary method for fabricating the semiconductor device 100 along line A-A' in FIG. 1, in accordance with some embodiments. Line A-A' is on a plane that is along the center line of the dummy gate structure 110 in the PFET region 100A and the NFET region 100B, and across the fin structure 106, the isolation structure 104 and the fin structure 108.

Still referring to FIG. 2J-3, a wet etching process 160 is performed on the area that is exposed through the patterned mask 150 to remove the portions of the passivation layer 145 and the NWF layer 144 in the PFET region 100A, in accordance with some embodiments. The etching amount of the wet etching process 160 is equal to or greater than the sum of the thickness T1 of the NWF layer 144, the thickness T2 of the passivation layer 145, and half of the width W of the first hard mask 124 and the semiconductor layers 122 in the PFET region 100A. The wet etching process 160 can remove the portions of the passivation layer 145 and the NWF layer 144 in the PFET region 100A. In some examples, the thickness T1 is in a range from about 8 Å to about 13 Å. The thickness T2 is in a range from about 3 Å to about 15 Å. The width W is in a range from about 100 Å to about 300 Å. The wet etching process 160 is performed with etchant solution, for example an acid solution of HCl, $NH_4OH$ or $H_2SO_4$ mixed with an oxidant of $H_2O_2$. The etching amount of the wet etching process 160 can be adjusted by changing the etching time and temperature.

The wet etching process 160 has strong over etching to remove the portions of the passivation layer 145 and the NWF layer 144 between the nanosheets 122 in the PFET region 100A. According to the embodiments of the disclosure, there is no lateral material loss of the NWF layer 144 along the boundary $L_B$ since the ultra-thin NWF layer 144 and the passivation layer 145 provide a difficult path for lateral removal by the wet etching process 160. In addition, the passivation layer 145 has excellent adhesion with the BARC 151 of the patterned mask 150 to enhance the boundary anchor. The boundary anchor of the NWF layer 144 is reinforced due to the excellent adhesion of the passivation layer 145 to prevent the lateral loss path along the boundary $L_B$. Therefore, the NWF layer 144 in the NFET region 100B is not damaged in the wet etching process 160. Moreover, the patterned mask 150 has great wet etching blocking ability in the wet etching process 160. The passivation layer 145 and the underlying NWF layer 144 and the semiconductor layers 122 in the NFET region 100B are protected by the patterned mask 150 in the wet etching process 160 without damage.

Figure 2K:
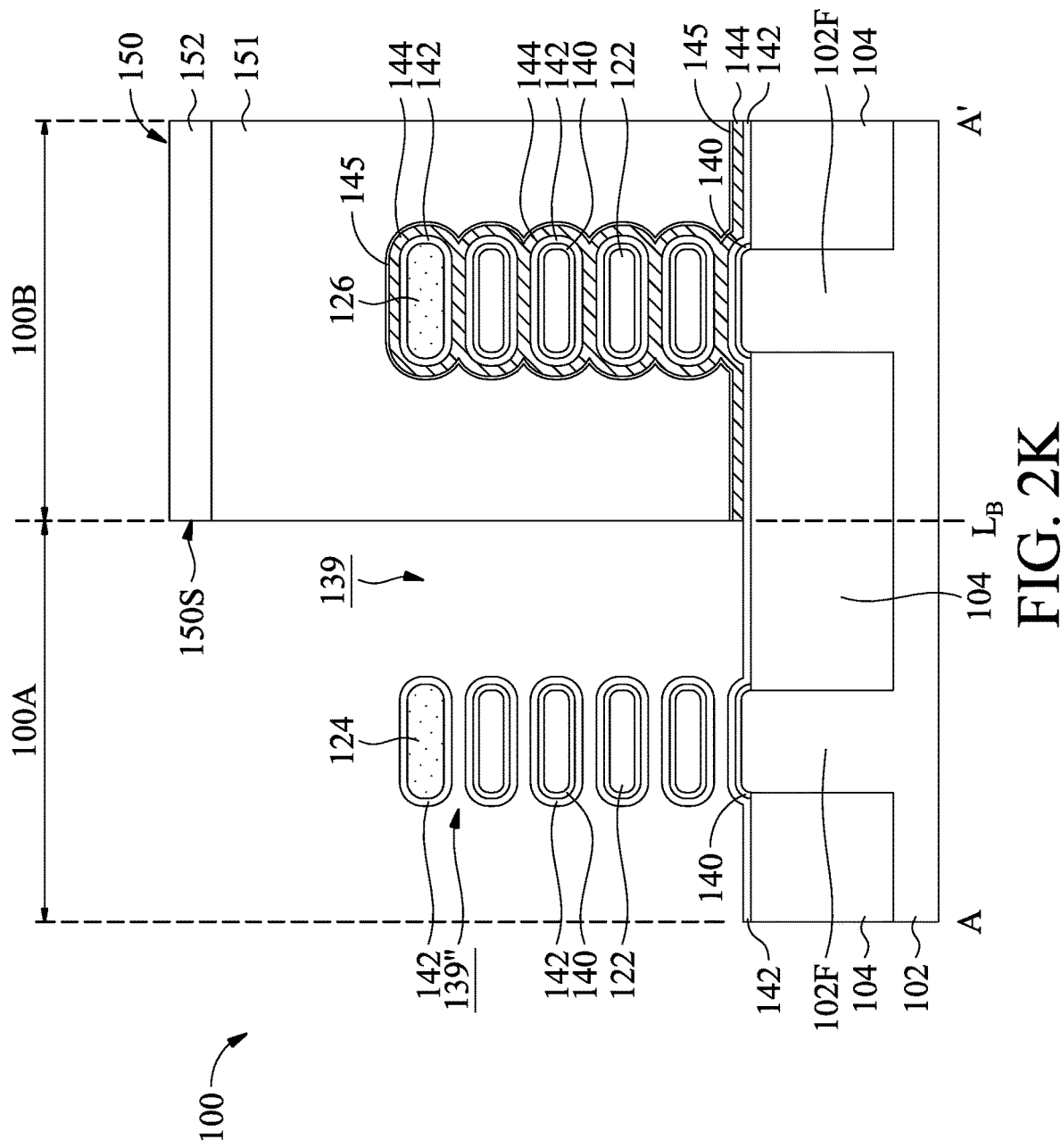

Thereafter, as shown in FIG. 2K, after the wet etching process 160, the portions of the NWF layer 144 and the passivation layer 145 in the PFET region 100A are removed to form multiple spaces 139" between the neighboring nanosheets 122, between the lowest nanosheet 122 and the fin base 102F, and between the topmost nanosheet 122 and the first hard mask 124, in accordance with some embodiments. The NWF layer 144 and the passivation layer 145 are patterned to have a sidewall that is aligned with the sidewall 150S of the patterned mask 150 at the boundary $L_B$ between the PFET region 100A and the NFET region 100B. In addition, the gate dielectric layer 142 remains in the PFET region 100A to surround the nanosheets 122 and the first hard mask 124, and on the surfaces of the fin base 102F and the isolation structure 104.

According to the embodiments of the disclosure, the boundary anchor of the patterned NWF layer 144 is enhanced due to the excellent adhesion of the passivation layer 145 with the BARC 151 of the patterned mask 150, and the ultra-thin thickness of the NWF layer 144. Therefore, the boundary of the NWF layer 144 in the NFET region 100B is anchored without material loss of the NWF layer 144.

The NWF layer 144 contains Al element therein. The Al diffusion from the NWF layer 144 towards the PFET region 100A would impact the threshold voltage (Vt) of PFET. According to the embodiments of the disclosure, the passivation layer 145 has great blocking ability to confine Al movement and to prevent Al diffusion from the NWF layer 144 towards the PFET region 100A. The passivation layer 145 covering the NWF layer 144 can avoid Al diffusion from the NWF layer 144 towards the PFET region 100A since Al diffusion is blocked by the passivation layer 145. In addition, the ultra-thin thickness of the NWF layer 144 can also prevent Al diffusion from the NWF layer 144 towards the PFET region 100A. The ultra-thin NWF layer 144 and the passivation layer 145 can reduce or eliminate the impact on Vt level and Vt uniformity of PFET. Therefore, the embodiments of the disclosure can achieve high Vt of the PFETs, better Vt control in terms of Vt level and Vt uniformity for the PFETs of the semiconductor devices 100.

Figure 2L:
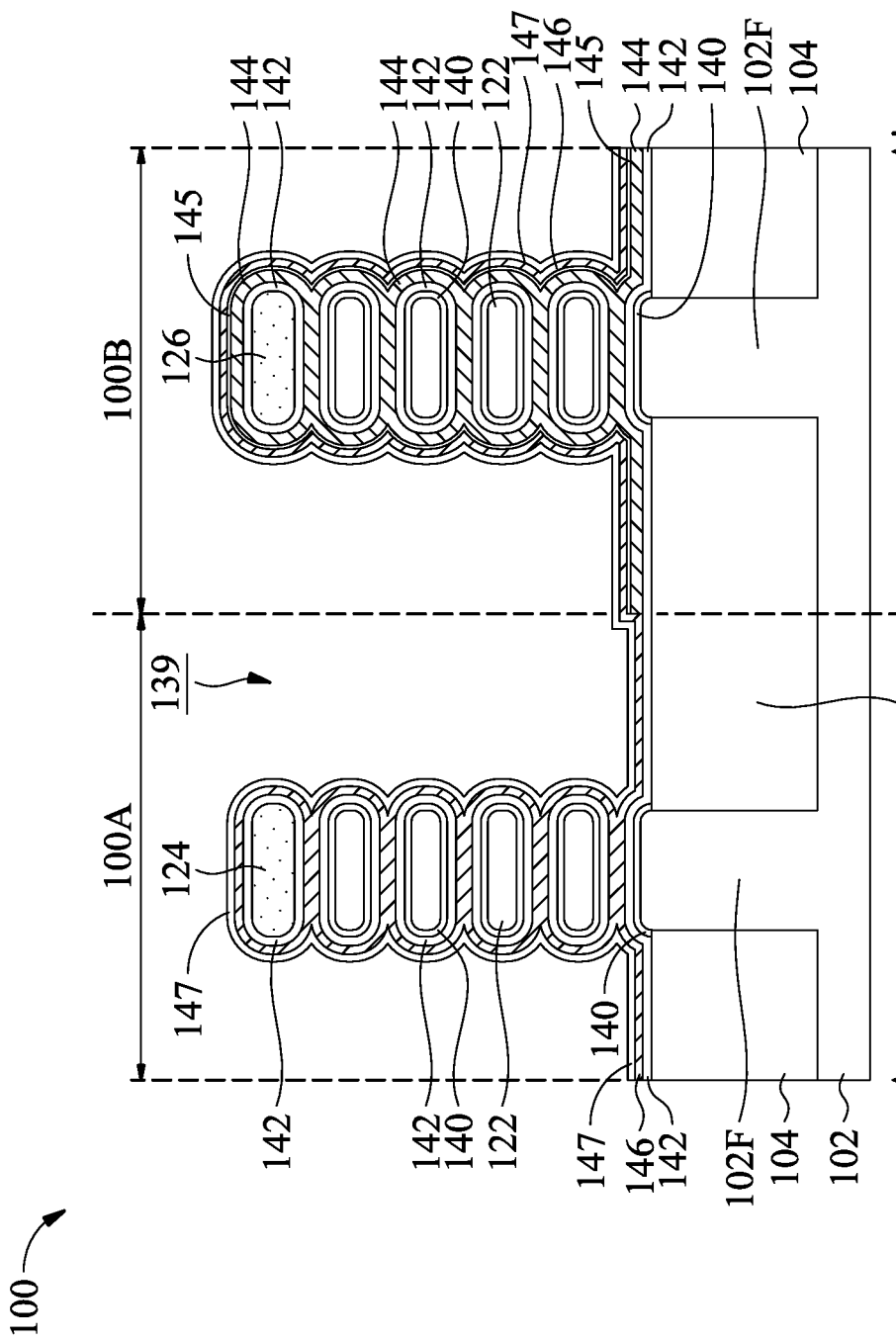

Next, referring to FIG. 2L, the patterned mask 150 is removed, and then a p-type work function (PWF) layer 146 and a capping layer 147 are deposited in sequence on the passivation layer 145 in the NFET region 100B and on the gate dielectric layer 142 in the PFET region 100A, in accordance with some embodiments. The patterned mask 150 may be removed by an ashing process using $N_2$ and $H_2$. The PWF layer 146 is conformally deposited on the passivation layer 145 in the NFET region 100B and is continuously deposited on the gate dielectric layer 142 in the PFET region 100A. The PWF layer 146 surrounds the nanosheets 122 and the first hard mask 124 in the PFET region 100A. In addition, the PWF layer 146 fills the spaces 139" (FIG. 2K) and some portions of the PWF layer 146 are merged in-between the nanosheets 122 of the PFET. The capping layer 147 is then conformally and continuously deposited on the PWF layer 146 in both the PFET region 100A and the NFET region 100B. The NWF layer 144 and the passivation layer 145 have a sidewall at the boundary $L_B$ between the PFET region 100A and the NFET region 100B. The PWF layer 146 and the capping layer 147 conformally deposited on the sidewall of the NWF layer 144 and the passivation layer 145.

In some embodiments, the PWF layer 146 includes TiN, TaN, TaSiN, $TaSi_2$, Ru, Mo, $MoSi_2$, $ZrSi_2$, $NiSi_2$, WN, WCN, TiSi or TiSiN. The PWF layer 146 has a thickness T3 that is greater than or equal to 8 Å and smaller than or equal to 15 Å, i.e. 8 Å≤T3≤15 Å. The PWF layer 146 may be deposited by ALD process. In addition, the capping layer 147 includes TaN, Si or $SiH_4$. The capping layer 147 has a thickness T4 that is greater than or equal to 10 Å and smaller than or equal to 20 Å, i.e. 10 Å≤T4≤20 Å. The capping layer 147 may be deposited by ALD process.

Figure 2M:
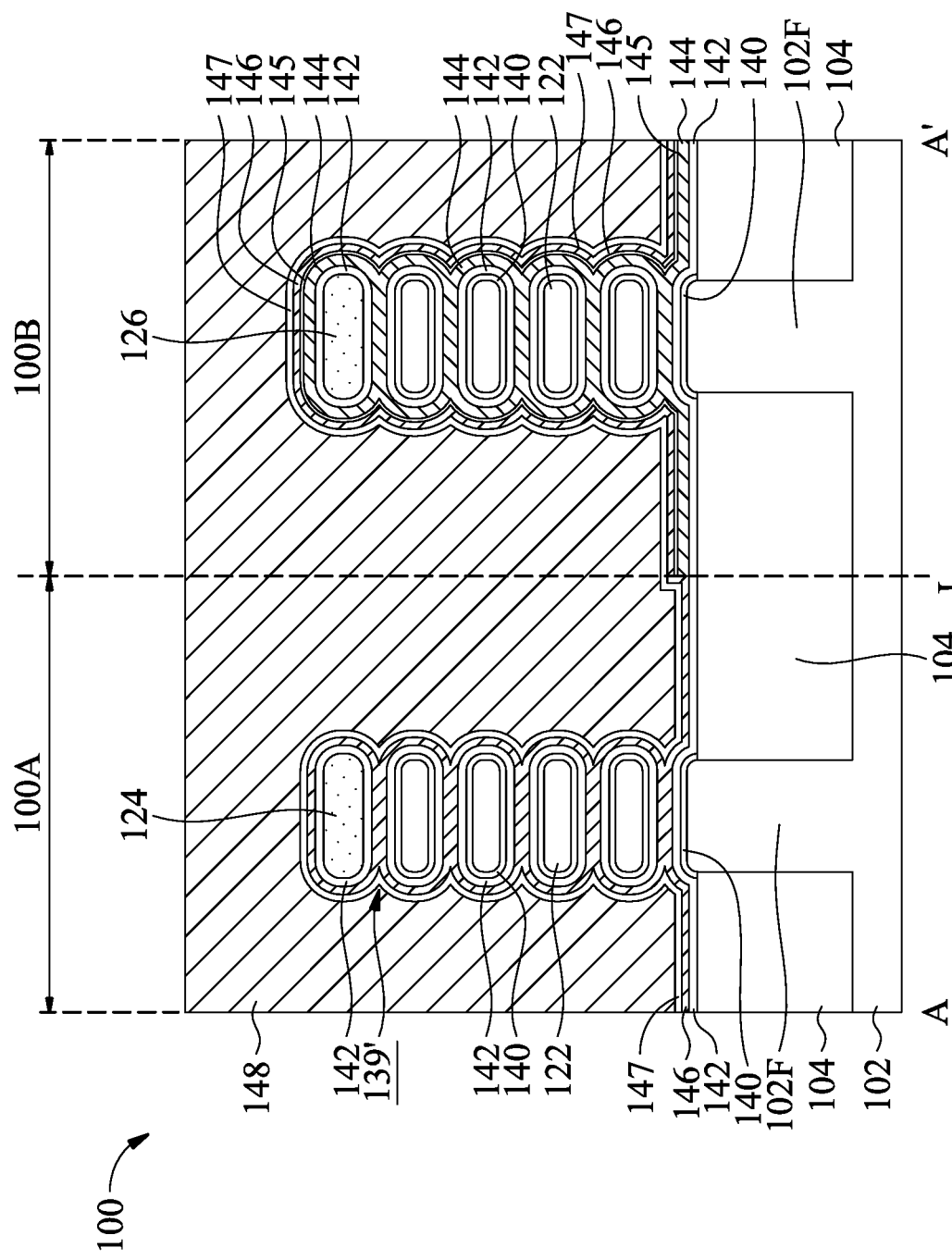

Afterwards, referring to FIG. 2M, a metal gate fill material 148 is formed on the capping layer 147 in the PFET region 100A and the NFET region 100B to completely fill the trench 139 (FIG. 2L), in accordance with some embodiments. The metal gate fill material 148 includes Co, W, Al, Ru, Cu, another suitable metal material or a combination thereof. The metal gate fill material 148 may be formed using a CVD and an electrochemical plating (ECP) processes.

Figure 2N:
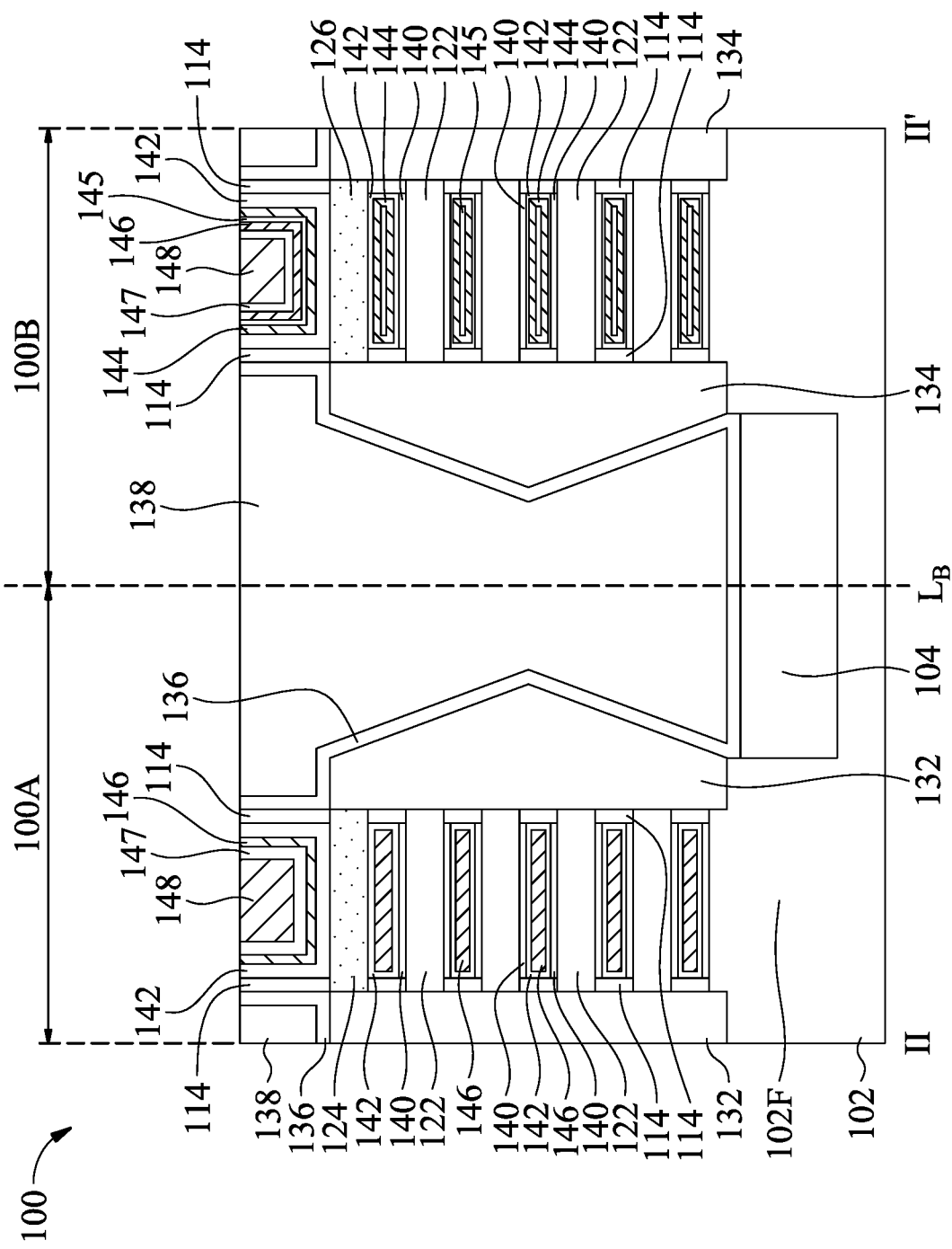

Returning to FIG. 2I-1, the gate dielectric layer 142, the NWF layer 144 and the passivation layer 145 are deposited on the top surfaces of the ILD layer 138, the CESL 136 and the gate spacers 114. In addition, the subsequently formed PWF layer 146, the capping layer 147 and the metal gate fill material 148 are also deposited on the top surfaces of the ILD layer 138, the CESL 136 and the gate spacers 114. Next, excess portions of the gate dielectric layer 142, the NWF layer 144, the passivation layer 145, the PWF layer 146, the capping layer 147 and the metal gate fill material 148 deposited on the top surfaces of the ILD layer 138, the CESL 136 and the gate spacers 114 are removed in a planarization process such as a CMP process, as shown in FIG. 2N in accordance with some embodiments. FIG. 2N is a cross-sectional view of the semiconductor device 100 along line II-IF in FIG. 1, in accordance with some embodiments. Thereafter, a GAA structure 170A is formed in the PFET region 100A, and a GAA structure 170B is formed in the NFET region 100B. The top surface of the GAA structures 170A and 170B may be coplanar with the top surfaces of the ILD layer 138, the CESL 136 and the gate spacers 114. The GAA structures 170A and 170B are formed in a gate-last process with replacement gate structures to surround the semiconductor layers (also referred to as nanosheets) 122 that serve as channel regions of the semiconductor device 100.

In some embodiments, for the GAA structure 170A of PFET, the spaces between the neighboring nanosheets 122, the space between the first hard mask 124 and the topmost nanosheet 122, and the space between the lowest nanosheet 122 and the fin base 102F are filled with the interfacial layer (IL) 140, the gate dielectric layer 142 and the PWF layer 146. The trench between the gate spacers 114 above the first hard mask 124 is filled with the gate dielectric layer 142, the PWF layer 146, the capping layer 147 and the metal gate fill material 148. The nanosheets 122 in the PFET region 100A may be referred to as first semiconductor nanosheets.

In some embodiments, for the GAA structure 170B of NFET, the spaces between the neighboring nanosheets 122, the space between the second hard mask 126 and the topmost nanosheet 122, and the space between the lowest nanosheet 122 and the fin base 102F are filled with the interfacial layer (IL) 140, the gate dielectric layer 142, the NWF layer 144 and the passivation layer 145. The trench between the gate spacers 114 above the second hard mask 126 is filled with the gate dielectric layer 142, the NWF layer 144, the passivation layer 145, the PWF layer 146, the capping layer 147 and the metal gate fill material 148. The nanosheets 122 in the NFET region 100B may be referred to as second semiconductor nanosheets.

Afterwards, via contacts (not shown) to the source and drain structures 132 and the source and drain structures 134 are formed in the ILD layer 138. The via contacts are formed to pass through the CESL layer 136 and to be in contact with the respective source and drain structures 132 and the respective source and drain structures 134. The via contacts are formed by forming contact holes in the ILD layer 138 and the CESL layer 136 using photolithography and etching processes. The source and drain structures 132 and the source and drain structures 134 are exposed through the contact holes.

Thereafter, the contact holes are filled with a conductive material using a deposition process. The conductive material of the via contacts includes a metal, such as Co, W, Cu, Al, Au, Ag, alloys thereof, or a combination thereof, and may be deposited by CVD, ALD, PVD, or another deposition technique. Next, excess portion of the conductive material over the ILD layer 138 is removed in a planarization process, such as a CMP process, to form the via contacts. Moreover, in each of the contact holes, a liner may be conformally deposited on the sidewalls and the bottom surface of the contact hole before filling the contact hole with the conductive material. The liner may be used as a diffusion barrier layer, an adhesion layer, or a combination thereof. The material of the liner may include Ti, TiN, Ta, TaN, or the like. The liner may be deposited by ALD, PECVD, MBD, PVD, or another deposition technique. In addition, an anneal process may be performed to facilitate a reaction between some portions of the liner and the source and drain structures 132 and the source and drain structures 134 to form silicide regions at the respective source and drain structures 132 and the respective source and drain structures 134.

Afterwards, an additional ILD layer (not shown) is formed on the ILD layer 138 and the GAA structures 170A and 170B. Contacts to the GAA structures 170A and 170B are formed in and pass through the additional ILD layer. The materials and the processes for forming the contacts to the GAA structures 170A and 170B may be the same as or similar to those described above with respect to the via contacts to the source and drain structures 132 and the source and drain structures 134.

According to some embodiments of the disclosure, the semiconductor devices 100 are fabricated for tightening spacing between nanowires or nanosheets in GAA structures. For examples, the spacing between nanowires or nanosheets may be smaller than or equal to 8 nm. The semiconductor devices 100 also have excellent mixed threshold voltages (Vts) boundary anchor for multiple patterning gates (MPG). The embodiments of the disclosure provide the ultra-thin NWF layer 144 and the passivation layer 145 for NFETs and use an n-type metal gate (NMG) patterning-first process to form multiple patterning gates such as the GAA structures 170A and 170B. The embodiments of the disclosure can avoid lateral removal of the NWF layer 144 in NFET region 100B during the wet etching process and thereby enhance NFET and PFET boundary anchor. Therefore, no NMG lateral is retreated along the boundary $L_B$ between the NFET region 100B and PFET region 100A. The GAA structures 170A and 170B of the NFET and PFET have excellent mixed-Vts boundary anchor without gate material loss.

In addition, the embodiments of the disclosure can prevent metal element such as Al diffusion from NMG towards PFET. Therefore, the embodiments of the disclosure can achieve high Vt of the PFET, better Vt control in terms of Vt level and uniformity for the PFETs of the semiconductor devices 100. The semiconductor devices 100 are such as FinFET devices with tightening spacing between nanowires or nanosheets for multiple patterning gates (MPGs) in GAA structures at technology nodes of N5 and beyond. The tightening spacing between nanowires or nanosheets can gain performance and lower resistor-capacitor (RC) delay of the semiconductor devices 100. According to the benefits mentioned above, the embodiments of the disclosure are suitable for semiconductor devices such as FinFET devices having GAA structures with MPGs mixed-Vts boundary at multiple technology nodes of N20, N16, N10, N7, N5, N3 and beyond.

In some embodiments, a method of fabricating a semiconductor device is provided. The method includes forming a plurality of first semiconductor nanosheets in a p-type device region and a plurality of second semiconductor nanosheets in an n-type device region. Both the first and second semiconductor nanosheets are spaced apart from each other. The method also includes depositing an n-type work function layer to surround each of the first semiconductor nanosheets and each of the second semiconductor nanosheets. The method further includes depositing a passivation layer on the n-type work function layer to surround each of the first semiconductor nanosheets and each of the second semiconductor nanosheets. In addition, the method includes forming a patterned mask on the passivation layer in the n-type device region, and removing the n-type work function layer and the passivation layer in the p-type device region in an etching process using the patterned mask as an etching mask. The method also includes removing the patterned mask after the etching process, and depositing a p-type work function layer to surround each of the first semiconductor nanosheets in the p-type device region and to cover the passivation layer in the n-type device region.

In some embodiments, a method of fabricating a semiconductor device is provided. The method includes forming a first fin structure in a p-type device region and a second fin structure in an n-type device region. Each of the first and second fin structures includes a stack of alternating first and second semiconductor layers, and a hard mask on the stack. The method also includes removing the first semiconductor layers of the first and second fin structures to form spaces between the second semiconductor layers and between the hard mask and the second semiconductor layer. The method further includes depositing a gate dielectric layer, an n-type work function layer and a passivation layer in sequence to surround each of the second semiconductor layers and the hard mask in the p-type and n-type device regions and to fill the spaces. In addition, the method includes forming a patterned mask in the n-type device region, and etching the n-type work function layer and the passivation layer in the p-type device region using the patterned mask as an etching mask. The patterned mask has a sidewall that is at the boundary between the p-type and n-type device regions. The method also includes removing the patterned mask, and depositing a p-type work function layer to surround each of the second semiconductor layers and the hard mask in the p-type device region and to cover the passivation layer in the n-type device region.

In some embodiments, a semiconductor device is provided. The semiconductor device includes a plurality of first semiconductor nanosheets spaced apart from each other and in a p-type device region, and a plurality of second semiconductor nanosheets spaced apart from each other and in an n-type device region. The semiconductor device also includes a gate dielectric layer surrounding each of the first semiconductor nanosheets and each of the second semiconductor nanosheets. The semiconductor device further includes an n-type work function layer on the gate dielectric layer and surrounding each of the second semiconductor nanosheets, and a passivation layer on the n-type work function layer and surrounding each of the second semiconductor nanosheets. In addition, the semiconductor device includes a p-type work function layer on the gate dielectric layer to surround each of the first semiconductor nanosheets and on the passivation layer, and a metal gate fill material over the p-type work function layer in the p-type and n-type device regions. The semiconductor device also includes first source and drain structures on opposite sides of the first semiconductor nanosheets, and second source and drain structures on opposite sides of the second semiconductor nanosheets.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
    forming a plurality of first semiconductor nanosheets in a p-type device region and a plurality of second semiconductor nanosheets in an n-type device region, wherein both the first and second semiconductor nanosheets are spaced apart from each other;
    depositing an n-type work function layer to surround each of the first semiconductor nanosheets and each of the second semiconductor nanosheets;
    depositing a passivation layer on the n-type work function layer to surround each of the first semiconductor nanosheets and each of the second semiconductor nanosheets, wherein the passivation layer is in contact with the n-type work function layer;
    forming a patterned mask on the passivation layer in the n-type device region;
    removing the n-type work function layer and the passivation layer in the p-type device region in an etching process using the patterned mask as an etching mask;
    removing the patterned mask after the etching process;
    depositing a p-type work function layer to surround each of the first semiconductor nanosheets in the p-type device region and to cover the passivation layer in the n-type device region;
    forming an interfacial layer to surround each of the first semiconductor nanosheets and each of the second semiconductor nanosheets before depositing the n-type work function layer; and
    depositing a gate dielectric layer on the interfacial layer to surround each of the first semiconductor nanosheets and each of the second semiconductor nanosheets before depositing the n-type work function layer.

2. The method as claimed in claim 1, wherein the patterned mask comprises a bottom anti-reflective coating (BARC) and a photoresist on the BARC, and the BARC is in direct contact with the passivation layer in the n-type device region.

3. The method as claimed in claim 1, wherein the patterned mask has a sidewall that is aligned with a boundary between the p-type and n-type device regions.

4. The method as claimed in claim 1, wherein the etching process comprises a wet etching process that removes the n-type work function layer and the passivation layer to form spaces between the first semiconductor nanosheets in the p-type device region.

5. The method as claimed in claim 1, further comprising forming a metal gate fill material over the p-type work function layer in the p-type and n-type device regions to form a first gate-all-around (GAA) structure and a second GAA structure in the p-type and n-type device regions, respectively.

6. The method as claimed in claim 1, wherein the n-type work function layer comprises TiAlC, TiAl, TaAlC, TaAlSiC, TiAlSiC or TiAlN, the n-type work function layer has a thickness that is in a range from about 8 Å to about 13 Å, and the n-type work function layer has an aluminum content that is in a range from about 25 atom % to about 36 atom %.

7. The method as claimed in claim 1, wherein the passivation layer comprises Si or SiH$_4$, and the passivation layer has a thickness that is in a range from about 3 Å to about 15 Å.

8. The method as claimed in claim 1, wherein the p-type work function layer comprises TiN, TaN, TaSiN, TaSi$_2$, Ru, Mo, MoSi$_2$, ZrSi$_2$, NiSi$_2$, WN, WCN, TiSi or TiSiN, and the p-type work function layer has a thickness that is in a range from about 8 Å to about 15 Å.

9. The method as claimed in claim 1, further comprising depositing a capping layer on the p-type work function layer in the p-type and n-type device regions.

10. The method as claimed in claim 9, wherein the capping layer comprises TaN, Si or SiH$_4$, and the capping layer has a thickness that is in a range from about 10 Å to about 20 Å.

11. A method of fabricating a semiconductor device, comprising:
    forming a first fin structure in a p-type device region and a second fin structure in an n-type device region, wherein each of the first and second fin structures includes a stack of alternating first and second semiconductor layers, and a hard mask on the stack;
    removing the first semiconductor layers of the first and second fin structures to form spaces between the second semiconductor layers and between the hard mask and the topmost second semiconductor layer;
    depositing a gate dielectric layer, an n-type work function layer and a passivation layer in sequence to surround each of the second semiconductor layers and the hard mask in the p-type and n-type device regions and to fill the spaces, wherein a sidewall of the passivation layer vertically overlaps a sidewall of the gate dielectric layer;
    forming a patterned mask in the n-type device region, wherein the patterned mask has a sidewall that is at a boundary between the p-type and n-type device regions;
    etching the n-type work function layer and the passivation layer in the p-type device region using the patterned mask as an etching mask;
    removing the patterned mask; and
    depositing a p-type work function layer to surround each of the second semiconductor layers and the hard mask in the p-type device region and to cover the passivation layer in the n-type device region,
    wherein the patterned mask comprises a bottom anti-reflective coating (BARC) and a photoresist on the BARC, and the BARC is in direct contact with the passivation layer in the n-type device region.

12. The method as claimed in claim 11, wherein the n-type work function layer comprises TiAlC, TiAl, TaAlC, TaAlSiC, TiAlSiC or TiAlN, the n-type work function layer has a thickness that is in a range from about 8 Å to about 13 Å, the n-type work function layer has an aluminum content that is in a range from about 25 atom % to about 36 atom %, the passivation layer comprises Si or SiH$_4$, and the passivation layer has a thickness that is in a range from about 3 Å to about 15 Å.

13. The method as claimed in claim 11, further comprising:
    depositing a capping layer on the p-type work function layer in the p-type and n-type device regions; and
    forming a metal gate fill material on the capping layer in the p-type and n-type device regions.

14. The method as claimed in claim 13, wherein the p-type work function layer comprises TiN, TaN, TaSiN, TaSi$_2$, Ru, Mo, MoSi$_2$, ZrSi$_2$, NiSi$_2$, WN, WCN, TiSi or TiSiN, the p-type work function layer has a thickness that is in a range from about 8 Å to about 15 Å, the capping layer comprises TaN, Si or SiH$_4$, and the capping layer has a thickness that is in a range from about 10 Å to about 20 Å.

15. The method as claimed in claim 11, wherein the hard mask in the p-type device region and the hard mask in the n-type device region are formed together.

16. A method of fabricating a semiconductor device, comprising:
    forming nanostructures in a p-type device region and an n-type device region of a substrate;
    forming a gate structure wrapping around the nanostructures and covering the substrate in the p-type region and the n-type region, wherein the gate structure comprises an n-type work function layer;
    conformally forming a passivation layer over the n-type work function layer, wherein a thickness of the passivation layer between fin structures and a thickness of the passivation layer over the fin structures are substantially the same;
    patterning and removing the n-type work function layer and the passivation layer in the p-type device region;
    comformally forming a p-type work function layer wrapping around the nanostructures and covering the substrate in the p-type region and the n-type region;
    conformally forming a capping layer over the p-type work function layer; and
    forming a patterned mask over the passivation layer in the n-type device region,
    wherein a sidewall of the n-type work function layer is substantially aligned with a boundary between the n-type device region and the p-type device region after removing the n-type work function layer and the passivation layer in the p-type device region.

17. The method as claimed in claim 16, wherein the n-type work function layer is separated from the nanostructure in the p-type device region after removing the n-type work function layer in the p-type device region.

18. The method as claimed in claim 16, wherein the passivation layer surrounds the n-type work function layer around the nanostructure in the n-type device region.

19. The method as claimed in claim 16, wherein the capping layer over a top surface of the substrate in the n-type device region is higher than the capping layer over a top surface of the substrate in the p-type region.

20. The method as claimed in claim 16, wherein the p-type work function layer covers a sidewall of the passivation layer at the boundary between the n-type device region and the p-type device region.

* * * * *